(12) United States Patent
Moseley et al.

(10) Patent No.: US 10,775,899 B2
(45) Date of Patent: Sep. 15, 2020

(54) TOUCH SENSITIVE KEYBOARD

(71) Applicant: Tactual Labs Co., New York, NY (US)

(72) Inventors: Braon Moseley, Round Rock, TX (US); Steven Leonard Sanders, New York, NY (US); David Clark Wilkinson, Austin, TX (US); Bruno Rodrigues De Araujo, Toronto (CA); Ricardo Jorge Jota Costa, Toronto (CA)

(73) Assignee: Tactual Labs Co., New York, NY (US)

( * ) Notice: Subject to any disclaimer, the term of this patent is extended or adjusted under 35 U.S.C. 154(b) by 0 days.

(21) Appl. No.: 16/238,714

(22) Filed: Jan. 3, 2019

(65) Prior Publication Data

US 2019/0155400 A1    May 23, 2019

Related U.S. Application Data

(63) Continuation of application No. 15/200,642, filed on Jul. 1, 2016, now Pat. No. 10,175,772.

(51) Int. Cl.
*G06F 3/02* (2006.01)
*G06F 3/041* (2006.01)
(Continued)

(52) U.S. Cl.
CPC .......... *G06F 3/0202* (2013.01); *G06F 3/0219* (2013.01); *G06F 3/044* (2013.01);
(Continued)

(58) Field of Classification Search
None
See application file for complete search history.

(56) References Cited

U.S. PATENT DOCUMENTS

| | | | |
|---|---|---|---|
| 2012/0092263 A1* | 4/2012 | Peterson | G06F 3/016 345/168 |
| 2014/0267140 A1* | 9/2014 | Leigh | G06F 3/044 345/174 |

(Continued)

*Primary Examiner* — Stephen T. Reed
(74) *Attorney, Agent, or Firm* — Adam Landa

(57) ABSTRACT

Disclosed are keyboards and keyboard switches sensitive to touch, including, hover and pressure. The keyboard switches have transmit and receive antennae that are spaced apart such that no portion of the transmit antenna touches any portion of the receive antenna. The keyboard switches are arranged in logical rows and logical columns such that each of the keyboard switches is associated with one row and one column. Signal emitters are conductively coupled to the transmit antennae for each of the keyboard switches associated with each of the rows, and each of the signal emitters are adapted to cause each of the transmit antennae to transmit one or more source signals. Receivers are coupled to the receive antennae for each of the keyboard switches associated with each of the columns, and each of the receivers are adapted to capture a frame of signals present on the coupled receive antennae. A signal processor adapted to determine a measurement from each frame, corresponding to an amount of the source signals present on the receive antennae during a time the corresponding frame was received. The signal processor further adapted to determine a keyboard switch touch state from a range of touch states based at least in part on the corresponding measurement.

17 Claims, 8 Drawing Sheets

(51) Int. Cl.
*G06F 3/044* (2006.01)
*H03K 17/96* (2006.01)

(52) U.S. Cl.
CPC ....... *G06F 3/0416* (2013.01); *H03K 17/9622* (2013.01); *G06F 2203/04108* (2013.01); *H03K 2217/94094* (2013.01); *H03K 2217/96076* (2013.01); *H03K 2217/960775* (2013.01)

(56) References Cited

U.S. PATENT DOCUMENTS

2015/0277504 A1* 10/2015 Odell .................... G06F 3/0202
　　　　　　　　　　　　　　　　　　　　361/679.09
2016/0259528 A1* 9/2016 Foss ...................... G06F 3/0482

* cited by examiner

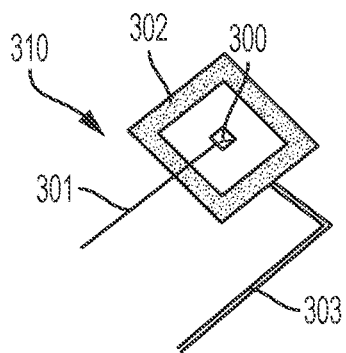
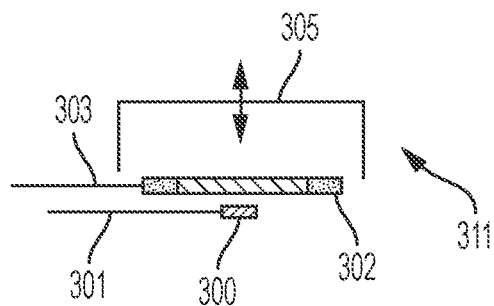
FIG. 3A
FIG. 3B
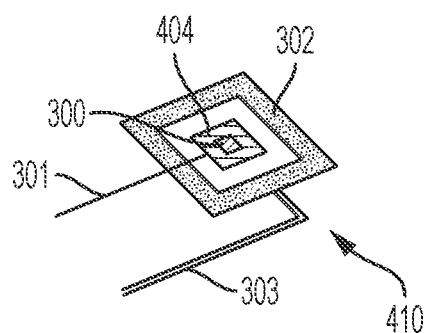
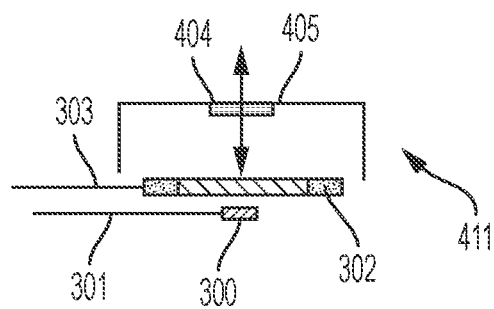
FIG. 4A
FIG. 4B
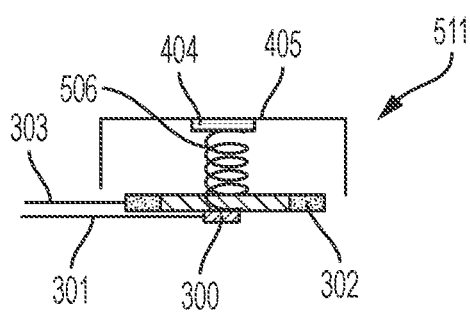
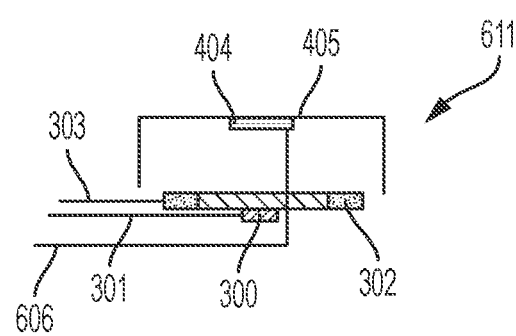
FIG. 5
FIG. 6

TOUCH SENSITIVE KEYBOARD

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The disclosed systems relate in general to the field of user input, and in particular to keyboards and keyboard switches sensitive to touch, including, hover and pressure.

BACKGROUND

Known methods generally have the drawback of relying on only contacts within the key to determine when a key has been depressed. The ability, as disclosed herein, to sense hover, contact and key depress information—and to have information available to understand a user's gestures and interactions—introduces myriad possibilities for interacting with touch devices.

BRIEF DESCRIPTION OF THE DRAWINGS

The foregoing and other objects, features, and advantages of the disclosure will be apparent from the following more particular description of embodiments as illustrated in the accompanying drawings, in which reference characters refer to the same parts throughout the various views. The drawings are not necessarily to scale, emphasis instead being placed upon illustrating principles of the disclosed embodiments.

FIGS. 3A and 3B show another exemplary embodiment of a keyboard switch.

FIGS. 4A and 4B show yet another exemplary embodiment of the keyboard switch.

FIG. 5 shows a further exemplary embodiment of the keyboard switch.

FIG. 6 shows a still further exemplary embodiment of the keyboard switch.

DETAILED DESCRIPTION

Figure 1A:
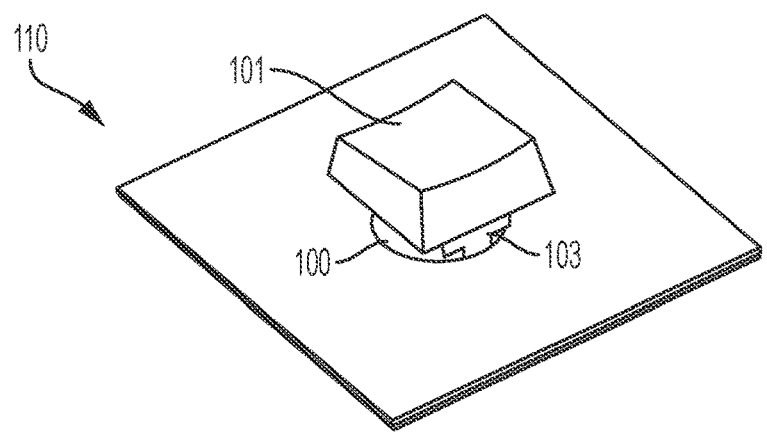
FIG. 1A shows a perspective view of an exemplary embodiment of a keyboard switch for use with a traditional-style keyboard.
Figure 1B:
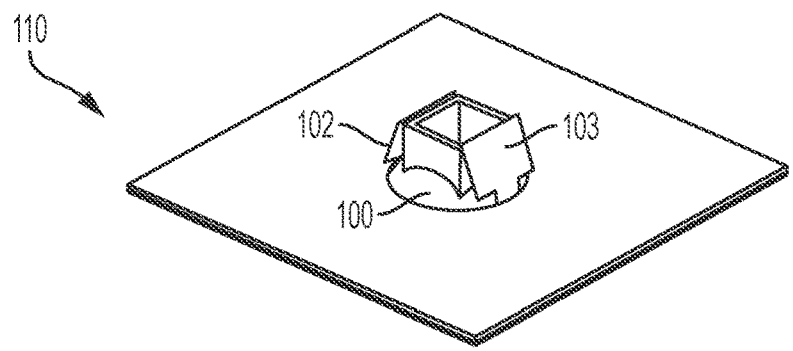
FIG. 1B shows a perspective view of the exemplary keyboard switch without a key cover.
Figure 1C:
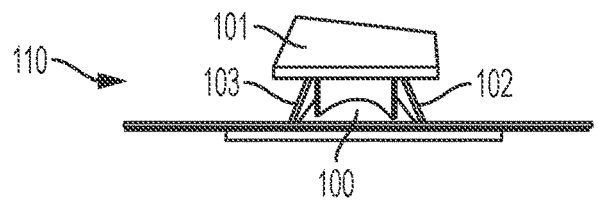
FIG. 1C shows a left side elevational view of the keyboard switch.
Figure 1D:
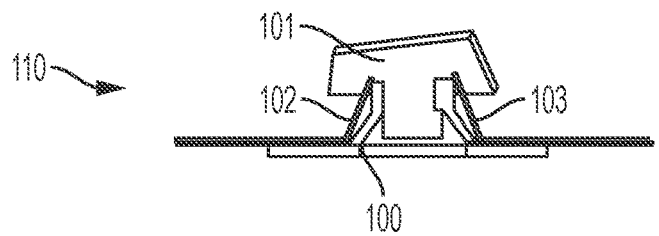
FIG. 1D shows a cross-sectional, right side view of the keyboard switch.

This application relates to user interfaces such as the fast multi-touch sensors and other interfaces disclosed in U.S. patent application Ser. No. 15/056,805, filed Feb. 29, 2016 entitled "Alterable Ground Plane for Touch Surfaces" and U.S. patent application Ser. No. 14/490,363 filed Sep. 18, 2014 entitled "Systems and Methods for Providing Response to User Input Using Information About State Changes and Predicting Future User Input." The entire disclosures of those applications are incorporated herein by reference.

In various embodiments, the present disclosure is directed to keyboards sensitive to hover, contact and pressure and their applications in real-world, virtual reality, and augmented reality settings. It will be understood by one of ordinary skill in the art that the disclosures herein apply generally to all types of keyboards, including but not limited to membrane keyboards, dome-switch keyboards, scissor-switch keyboards, capacitive keyboards, mechanical-switch keyboards, buckling-spring keyboards, hall-effect keyboards, laser projection keyboard, roll-up keyboards, and optical keyboard technology.

Throughout this disclosure, the terms "hover", "touch", "touches," "contact," "contacts," "pressure," "pressures" or other descriptors may be used to describe events or periods of time in which a user's finger, a stylus, an object or a body part is detected by the sensor. In some embodiments, and as generally denoted by the word "contact", these detections occur when the user is in physical contact with a sensor, or a device in which it is embodied. In other embodiments, and as generally referred to by the term "hover", the sensor may be tuned to allow the detection of "touches" that are hovering at a distance above the touch surface or otherwise separated from the touch sensitive device. As used herein, "touch surface" includes a keyboard or key; however, as is readily understood, the touch surface may not have actual keys or features, and could be a generally feature-sparse surface. The use of language within this description that implies reliance upon sensed physical contact should not be taken to mean that the techniques described apply only to those embodiments; indeed, generally, what is described herein applies equally to "contact" and "hover", each of which being a "touch". More generally, as used herein, the term "touch" refers to an act that can be detected by the types of sensors disclosed herein, thus, as used herein the term "hover" is one type of "touch" in the sense that "touch" is intended herein. "Pressure" refers to the pressure of "contact", i.e., a force with which a user presses their fingers or hand against the key or other surface. The amount of "pressure" is similarly a measure of "touch". It should also be noted that a depressed key is a further type of "touch", thus, generally, as described herein, "touch" refers to the states of "hover", "contact" and a fully depressed key, whereas a lack of "touch" is generally identified by signals being below a threshold for accurate measurement by the sensor.

As used herein, and especially within the claims, ordinal terms such as first and second are not intended, in and of themselves, to imply sequence, time or uniqueness, but rather, are used to distinguish one claimed construct from another. In some uses where the context dictates, these terms may imply that the first and second are unique. For example, where an event occurs at a first time, and another event occurs at a second time, there is no intended implication that the first time occurs before the second time. However, where the further limitation that the second time is after the first time is presented in the claim, the context would require reading the first time and the second time to be unique times. Similarly, where the context so dictates or permits, ordinal terms are intended to be broadly construed so that the two identified claim constructs can be of the same characteristic or of different characteristic. Thus, for example, a first and a second frequency, absent further limitation, could be the same frequency—e.g., the first frequency being 10 Mhz and the second frequency being 10 Mhz; or could be different frequencies—e.g., the first frequency being 10 Mhz and the second frequency being 11 Mhz. Context may dictate otherwise, for example, where a first and a second frequency are further limited to being orthogonal to each other, in which case, they could not be the same frequency.

The presently disclosed systems provide for designing, manufacturing and using capacitive touch sensors, and particularly capacitive touch sensors that employ a multiplexing scheme based on orthogonal signaling such as but not limited to frequency-division multiplexing (FDM), code-division multiplexing (CDM), or a hybrid modulation technique that combines both FDM and CDM methods. References to frequency herein could also refer to other orthogonal signal bases. As such, this application incorporates by reference Applicants' prior U.S. patent application Ser. No. 13/841,436, filed on Mar. 15, 2013 entitled "Low-Latency Touch Sensitive Device" and U.S. patent application Ser. No. 14/069,609 filed on Nov. 1, 2013 entitled "Fast Multi-Touch Post Processing." These applications contemplate capacitive FDM, CDM, or FDM/CDM hybrid touch sensors which may be used in connection with the presently disclosed sensors. In such sensors, touches are sensed when a signal from a row is coupled (increased) or decoupled (decreased) to a column and the result received on that column.

This disclosure will first describe the operation of fast multi-touch sensors to which the present systems and methods for design, manufacturing and use can be applied. Details of the presently disclosed systems related to keyboards sensitive to hover, contact and pressure are then described further below under the heading "Keyboard Embodiment."

As used herein, the phrase "touch event" and the word "touch" when used as a noun include a near touch and a near touch event, or any other gesture that is identified using a sensor. In accordance with an embodiment, touch events may be detected, processed and supplied to downstream computational processes with very low latency, e.g., on the order of ten milliseconds or less, or on the order of less than one millisecond.

In an embodiment, the disclosed fast multi-touch sensor utilizes a projected capacitive method that has been enhanced for high update rate and low latency measurements of touch events. The technique can use parallel hardware and higher frequency waveforms to gain the above advantages. In an embodiment, disclosed methods and apparatus can be used to make sensitive and robust measurements, which methods may be used on transparent display surfaces and which may permit economical manufacturing of products which employ the technique. In an embodiment, disclosed methods and apparatus may be used on traditional keyboards, membrane keyboards and other keyboards having keys, as well as on feature-sparse or haptic keying surfaces, and on various keyboard switches (i.e., keys), and which may permit economical manufacturing of products which employ the technique. In this regard, a "capacitive object" as used herein could be a finger, other part of the human body, a stylus, or any object to which the sensor is sensitive. The sensors and methods disclosed herein need not rely on capacitance. With respect to, e.g., the optical sensor, such embodiments utilize photon tunneling and leaking to sense a touch event, and a "capacitive object" as used herein includes any object, such as a stylus or finger, that that is compatible with such sensing. Similarly, "touch locations" and "touch sensitive device" as used herein do not require actual touching contact between a capacitive object and the disclosed sensor.

As described in U.S. patent application Ser. No. 14/216,948, entitled "Fast Multi-Touch Stylus and Sensor," filed on Mar. 17, 2014, fast multi-touch sensors transmit a different signal onto each of the unit's rows. The entire disclosure of this application is incorporated herein by reference. The signals are generally designed to be "orthogonal", i.e., separable and distinguishable from each other. A receiver is attached to each of the unit's arbitrarily designated column. The receiver is designed to receive any of the transmitted signals, or an arbitrary combination of them, with or without other signals and/or noise, and to individually determine a measure, e.g., a quantity for each of the orthogonal transmitted signals present on that column. The touch surface of the sensor comprises a series of rows and columns along which the orthogonal signals can propagate. In an embodiment, the rows and columns are designed so that, when they are not subject to a touch event, one amount of signal is coupled between them, whereas, when they are subject to a touch event, another amount of signal is coupled between them. In an embodiment, a lesser amount of signal may represent a touch event, and a greater amount of signal may represent a lack of touch. Because the touch sensor ultimately detects touch due to a change in the coupling, it is not of specific importance, except for reasons that may otherwise be apparent to a particular embodiment, whether the touch-related coupling causes an increase in amount of row signal present on the column or a decrease in the amount of row signal present on the column. As discussed above, the touch, or touch event does not require a physical touching, but rather an event that affects the level of coupled signal.

In an embodiment, generally, the capacitive result of a touch event in the proximity of both a row and column may cause a non-negligible change in the amount of signal present on the row being coupled to the column. More generally, touch events cause, and thus correspond to, the received signals on the columns. Because the signals on the rows are orthogonal, multiple row signals can be coupled to a column and distinguished by the receiver. Likewise, the signals on each row can be coupled to multiple columns. For each column coupled to a given row (and regardless of whether the coupling causes an increase or decrease in the row signal to be present on the column), the signals found on the column contain information that will indicate which rows are being touched in proximity to that column. The quantity of each signal received is generally related to the amount of coupling between the column and the row carrying the corresponding signal, and thus, may indicate a distance of the touching object to the surface, an area of the surface covered by the touch and/or the pressure of the touch.

When a row and column are touched simultaneously, some of the signal that is present on the row is coupled into the corresponding column (the coupling may cause an increase or decrease of the row signal on the column). (As discussed above, the term touch or touched does not require actual physical contact, but rather, relative proximity.) Indeed, in various implementations of a touch device, physical contact with the rows and/or columns is unlikely as there may be a protective barrier between the rows and/or columns and the finger or other object of touch. Moreover, generally, the rows and columns themselves are not in touch with each other, but rather, placed in a proximity that allows an amount of signal to be coupled there-between, and that amount changes (positively or negatively) with touch. Generally, the row-column coupling results not from actual contact between them, nor by actual contact from the finger or other object of touch, but rather, by the capacitive effect of bringing the finger (or other object) into close proximity—which close proximity resulting in capacitive effect is referred to herein as touch.

As is detailed in U.S. patent application Ser. No. 15/200, 320, filed Jul. 1, 2016, entitled "Systems and Methods for Sensing Pressure in Touch Sensitive Devices," the entire disclosure of which is incorporated herein by reference, where there is actual physical contact, there is a relationship between the size and shape of the contact area between finger and touch surface and the amount of pressure applied to the surface. Because the human finger is not rigid, over a range, it deforms in accordance with pressure. As such, the contact area of a finger is generally larger when a high-level of pressure is applied to the touch surface and smaller when a lower-level of pressure is applied. Similarly, with respect to capacitive coupling between rows and columns in a capacitive touch sensor, generally, the greater the pressure applied, the higher the capacitive coupling. The amount of capacitive coupling can be inferred by the touch system's usual method of operation. In an embodiment, changes in the amount of capacitive coupling will change measured signal strength between rows and columns. A greater-level of pressure causes more skin, fat, muscle, and tissue to come in close contact with the touch surface, and these parts of the human body provide the conductance and dielectric which result in increased capacitive coupling.

The nature of the rows and columns is arbitrary and the particular orientation is irrelevant. Indeed, the terms row and column are not intended to refer to a square grid, but rather to a set of conductors upon which signal is transmitted (rows) and a set of conductors onto which signal may be coupled (columns). (The notion that signals are transmitted on rows and received on columns itself is arbitrary, and signals could as easily be transmitted on conductors arbitrarily named columns and received on conductors arbitrarily named rows, or both could arbitrarily be named something else.) Further, it is not necessary that the rows and columns be in a grid. Other shapes are possible as long as a touch event will touch part of a "row" and part of a "column", and cause some form of coupling. For example, the "rows" could be in concentric circles and the "columns" could be spokes radiating out from the center. And neither the "rows" nor the "columns" need to follow any geometric or spatial pattern, thus, for example, the keys on a keyboard can be arbitrarily connected to form rows and columns (related or unrelated to their relative positions.) Moreover, it is not necessary for there to be only two types signal propagation channels: instead of rows and columns, in an embodiment, channels "A", "B" and "C" may be provided, where signals transmitted on "A" could be received on "B" and "C", or, in an embodiment, signals transmitted on "A" and "B" could be received on "C". It is also possible that the signal propagation channels can alternate function, sometimes supporting transmission and sometimes supporting receipt. It is also contemplated that the signal propagation channels can simultaneously support transmitters and receivers—provided that the signals transmitted are orthogonal, and thus separable, from the signals received. Three or more types of antenna conductors may be used rather than just "rows" and "columns." Many alternative embodiments are possible and will be apparent to a person of skill in the art after considering this disclosure.

As noted above, in an embodiment the touch surface comprises of a series of rows and columns, along which signals can propagate. As discussed above, the rows and columns are designed so that, when they are not being touched, one amount of signal is coupled between them, and when they are being touched, another amount of signal is coupled between them. The change in signal coupled between them may be generally proportional or inversely proportional (although not necessarily linearly proportional) to the touch such that touch is less of a yes-no question, and more of a gradation, permitting distinction between more touch (i.e., closer or firmer) and less touch (i.e., farther or softer)—and even no touch. Moreover, a different signal is transmitted into each of the rows. In an embodiment, each of these different signals are orthogonal (i.e., separable and distinguishable) from one another. When a row and column are touched simultaneously, signal that is present on the row is coupled (positively or negatively), causing more or less to appear in the corresponding column. The quantity of the signal that is coupled onto a column may be related to the proximity, pressure or area of touch.

A receiver is attached to each column. The receiver is designed to receive the signals present on the columns, including any of the orthogonal signals, or an arbitrary combination of the orthogonal signals, and any noise or other signals present. Generally, the receiver is designed to receive a frame of signals present on the columns, and to identify the columns providing signal. In an embodiment, the receiver (or a signal processor associated with the receiver data) may determine a measure associated with the quantity of each of the orthogonal transmitted signals present on that column during the time the frame of signals was captured. In this manner, in addition to identifying the rows in touch with each column, the receiver can provide additional (e.g., qualitative) information concerning the touch. In general, touch events may correspond (or inversely correspond) to received signals on the columns. For each column, the different signals received thereon indicate which of the corresponding rows is being touched in proximity with that column. In an embodiment, the amount of coupling between the corresponding row and column may indicate e.g., the area of the surface covered by the touch, the pressure of the touch, etc. In an embodiment, a change in coupling over time between the corresponding row and column indicates a change in touch at the intersection of the two.

Simple Sinusoid Embodiment

In an embodiment, the orthogonal signals being transmitted onto the rows may be unmodulated sinusoids, each having a different frequency, the frequencies being chosen so that they can be distinguished from each other in the receiver. In an embodiment, frequencies are selected to provide sufficient spacing between them such that they can be more easily distinguished from each other in the receiver. In an embodiment, frequencies are selected such that no simple harmonic relationships exist between the selected frequencies. The lack of simple harmonic relationships may mitigate non-linear artifacts that can cause one signal to mimic another.

Generally, a "comb" of frequencies, where the spacing between adjacent frequencies is constant, and the highest frequency is less than twice the lowest, will meet these criteria if the spacing between frequencies, $\Delta f$, is at least the reciprocal of the measurement period $\tau$. For example, if it is desired to measure a combination of signals (from a column, for example) to determine which row signals are present once per millisecond ($\tau$), then the frequency spacing ($\Delta f$) must be greater than one kilohertz (i.e., $\Delta f > 1/\tau$). According to this calculation, in an example case with only ten rows, one could use the following frequencies:

| Row 1:  | 5.000 MHz |
|---------|-----------|
| Row 2:  | 5.001 MHz |
| Row 3:  | 5.002 MHz |
| Row 4:  | 5.003 MHz |
| Row 5:  | 5.004 MHz |
| Row 6:  | 5.005 MHz |
| Row 7:  | 5.006 MHz |
| Row 8:  | 5.007 MHz |
| Row 9:  | 5.008 MHz |
| Row 10: | 5.009 MHz |

It will be apparent to one of skill in the art that frequency spacing may be substantially greater than this minimum to permit robust design. As an example, a 20 cm by 20 cm touch surface with 0.5 cm row/column spacing would require forty rows and forty columns and necessitate sinusoids at forty different frequencies. While a once per millisecond analysis rate would require only 1 KHz spacing, an arbitrarily larger spacing is utilized for a more robust implementation. In an embodiment, the arbitrarily larger spacing is subject to the constraint that the maximum frequency should not be more than twice the lowest (i.e., $f_{max} < 2(f_{min})$). Thus, in an exemplary embodiment, a frequency spacing of 100 kHz with the lowest frequency set at 5 MHz may be used, yielding a frequency list of 5.0 MHz, 5.1 MHz, 5.2 MHz, etc. up to 8.9 MHz.

In an embodiment, each of the sinusoids on the list may be generated by a signal generator and transmitted on a separate row by a signal emitter or transmitter. In an embodiment, the sinusoids may be pre-generated. To identify the rows and columns that are being simultaneously touched, a receiver receives any signals present on the columns and a signal processor analyzes the signal to determine which, if any, frequencies on the list appear. In an embodiment, the identification can be supported with a frequency analysis technique (e.g., Fourier transform), or by using a filter bank. In an embodiment, the receiver receives a frame of column signals, which frame is processed through an FFT, and thus, a measure is determined for each frequency. In an embodiment, the FFT provides an in-phase and quadrature measure for each frequency, for each frame.

In an embodiment, from each column's signal, the receiver/signal processor can determine a value (and in an embodiment an in-phase and quadrature value) for each frequency from the list of frequencies found in the signal on that column. In an embodiment, where the value corresponding to a frequency is greater or lower than some threshold, or changes from a prior value, that information is used to identify a touch event between the column and the row corresponding to that frequency. In an embodiment, signal strength information, which may correspond to various physical phenomena including the distance of the touch from the row/column intersection, the size of the touch object, the pressure with which the object is pressing down, the fraction of row/column intersection that is being touched, etc. may be used as an aid to localize the area of the touch event. In an embodiment, the determined values are not self-determinative of touch, but rather are further processed along with other values to determine touch events.

Once values for each of the orthogonal frequencies have been determined for at least two frequencies (corresponding to rows) or for at least two columns, a two-dimensional map can be created, with the value being used as, or proportional/inversely proportional to, a value of the map at that row/column intersection. In an embodiment, values are determined at multiple row/column intersections on a touch surface to produce a map for the touch surface or region. In an embodiment, values are determined for every row/column intersection on a touch surface, or in a region of a touch surface, to produce a map for the touch surface or region. In an embodiment, the signals' values are calculated for each frequency on each column. Once signal values are calculated a two-dimensional map may be created. In an embodiment, the signal value is the value of the map at that row/column intersection. In an embodiment, the signal value is processed to reduce noise before being used as the value of the map at that row/column intersection. In an embodiment, another value proportional, inversely proportional or otherwise related to the signal value (either after being processed to reduce noise) is employed as the value of the map at that row/column intersection. In an embodiment, due to physical differences in the touch surface at different frequencies, the signal values are normalized for a given touch or calibrated. Similarly, in an embodiment, due to physical differences across the touch surface or between the intersections, the signal values need to be normalized for a given touch or calibrated.

In an embodiment, touch events are identified using a map produced from the value information, and thus, take into account the value changes of neighboring row/column intersections. In an embodiment, the two-dimensional map data may be thresholded to better identify, determine or isolate touch events. In an embodiment, the two-dimensional map data may be used to infer information about the shape, orientation, etc. of the object touching the surface.

In an embodiment, such analysis and touch processing described herein may be performed on a touch sensor's discrete touch controller. In another embodiment, such analysis and touch processing may be performed on other computer system components such as but not limited to one or more ASIC, MCU, FPGA, CPU, GPU, SoC, DSP or dedicated circuit. The term "hardware processor" as used herein means any of the above devices or any other device (now known or hereinafter developed) which performs computational functions.

Returning to the discussion of the signals being transmitted on the rows, a sinusoid is not the only orthogonal signal that can be used in the configuration described above. Indeed, as discussed above, any set of signals that can be distinguished from each other will work. Nonetheless, sinusoids may have some advantageous properties that may permit simpler engineering and more cost efficient manufacture of devices which use this technique. For example, sinusoids have a very narrow frequency profile (by definition), and need not extend down to low frequencies, near DC. Moreover, sinusoids can be relatively unaffected by 1/f noise, which noise could affect broader signals that extend to lower frequencies.

In an embodiment, sinusoids may be detected by a filter bank. In an embodiment, sinusoids may be detected by frequency analysis techniques (e.g., Fourier transform/fast Fourier transform). Frequency analysis techniques may be implemented in a relatively efficient manner and may tend to have good dynamic range characteristics, allowing them to detect and distinguish between a large number of simultaneous sinusoids. In broad signal processing terms, the receiver's decoding of multiple sinusoids may be thought of as a form of frequency-division multiplexing. In an embodiment, other modulation techniques such as time-division and code-division multiplexing can also be used. Time division multiplexing has good dynamic range characteristics, but typically requires that a finite time be expended transmitting into (or analyzing received signals from) the touch surface. Code division multiplexing has the same simultaneous nature as frequency-division multiplexing, but may encounter dynamic range problems and may not distinguish as easily between multiple simultaneous signals.

Modulated Sinusoid Embodiment

In an embodiment, a modulated sinusoid may be used in lieu of, in combination with and/or as an enhancement of, the sinusoid embodiment described above. The use of unmodulated sinusoids may cause radiofrequency interference to other devices near the touch surface, and thus, a device employing them might encounter problems passing regulatory testing (e.g., FCC, CE). In addition, the use of unmodulated sinusoids may be susceptible to interference from other sinusoids in the environment, whether from deliberate transmitters or from other interfering devices (perhaps even another identical touch surface). In an embodiment, such interference may cause false or degraded touch measurements in the described device.

In an embodiment, to avoid interference, the sinusoids may be modulated or "stirred" prior to being transmitted by the transmitter in a manner that the signals can be demodulated ("unstirred") once they reach the receiver. In an embodiment, an invertible transformation (or nearly invertible transformation) may be used to modulate the signals such that the transformation can be compensated for and the signals substantially restored once they reach the receiver. As will also be apparent to one of skill in the art, signals emitted or received using a modulation technique in a touch device as described herein will be less correlated with other things, and thus, act more like mere noise, rather than appearing to be similar to, and/or being subject to interference from, other signals present in the environment.

U.S. patent application Ser. No. 13/841,436, filed Mar. 15, 2013, entitled "Low-Latency Touch Sensitive Device," discloses embodiments directed to frequency modulation, direct sequence spread spectrum modulation, and low cost implementation embodiments. The entire disclosure of the application is incorporated herein by reference.

Sinusoid Detection

In an embodiment, sinusoids may be detected in a receiver using a complete radio receiver with a Fourier Transform detection scheme. Such detection may require digitizing a high-speed RF waveform and performing digital signal processing thereupon. Separate digitization and signal processing may be implemented for every column of the surface; this permits the signal processor to discover which of the row signals are in touch with that column. In the above-noted example, having a touch surface with forty rows and forty columns, would require forty copies of this signal chain. Today, digitization and digital signal processing are relatively expensive operations, in terms of hardware, cost, and power. It would be useful to utilize a more cost-effective method of detecting sinusoids, especially one that could be easily replicated and requires very little power.

In an embodiment, sinusoids may be detected using a filter bank. A filter bank comprises an array of bandpass filters that can take an input signal and break it up into the frequency components associated with each filter. The Discrete Fourier Transform (DFT, of which the FFT is an efficient implementation) is a form of a filter bank with evenly-spaced bandpass filters that may be used for frequency analysis. DFTs may be implemented digitally, but the digitization step may be expensive. It is possible to implement a filter bank out of individual filters, such as passive LC (inductor and capacitor) or RC active filters. Inductors are difficult to implement well on VLSI processes, and discrete inductors are large and expensive, so it may not be cost effective to use inductors in the filter bank.

At lower frequencies (about 10 MHz and below), it is possible to build banks of RC active filters on VLSI. Such active filters may perform well, but may also take up a lot of die space and require more power than is desirable.

At higher frequencies, it is possible to build filter banks with surface acoustic wave (SAW) filter techniques. These allow nearly arbitrary FIR filter geometries. SAW filter techniques require piezoelectric materials which are more expensive than straight CMOS VLSI. Moreover, SAW filter techniques may not allow enough simultaneous taps to integrate sufficiently many filters into a single package, thereby raising the manufacturing cost.

In an embodiment, sinusoids may be detected using an analog filter bank implemented with switched capacitor techniques on standard CMOS VLSI processes that employs an FFT-like "butterfly" topology. The die area required for such an implementation is typically a function of the square of the number of channels, meaning that a 64-channel filter bank using the same technology would require only $1/256$th of the die area of the 1024-channel version. In an embodiment, the complete receive system for the low-latency touch sensor is implemented on a plurality of VLSI dies, including an appropriate set of filter banks and the appropriate amplifiers, switches, energy detectors, etc. In an embodiment, the complete receive system for the low-latency touch sensor is implemented on a single VLSI die, including an appropriate set of filter banks and the appropriate amplifiers, switches, energy detectors, etc. In an embodiment, the complete receive system for the low-latency touch sensor is implemented on a single VLSI die containing n instances of an n-channel filter bank, and leaving room for the appropriate amplifiers, switches, energy detectors, etc.

Sinusoid Generation

Generating the transmit signals (e.g., sinusoids) in a low-latency touch sensor is generally less complex than detection, principally because each row requires the generation of a single signal (or a small number of signals) while the column receivers have to detect and distinguish between many signals. In an embodiment, sinusoids can be generated with a series of phase-locked loops (PLLs), each of which multiply a common reference frequency by a different multiple.

In an embodiment, the low-latency touch sensor design does not require that the transmitted sinusoids are of very high quality, but rather, may accommodate transmitted sinusoids that have more phase noise, frequency variation (over time, temperature, etc.), harmonic distortion and other imperfections than may usually be allowable or desirable in radio circuits. In an embodiment, the large number of frequencies may be generated by digital means and then employ a relatively coarse digital-to-analog conversion process. As discussed above, in an embodiment, the generated row frequencies should have no simple harmonic relationships with each other, any non-linearities in the generation process should not cause one signal in the set to "alias" or mimic another.

In an embodiment, a frequency comb may be generated by having a train of narrow pulses filtered by a filter bank, each filter in the bank outputting the signals for transmission on a row. The frequency "comb" is produced by a filter bank that may be identical to a filter bank that can be used by the receiver. As an example, in an embodiment, a 10 nanosecond pulse repeated at a rate of 100 kHz is passed into the filter bank that is designed to separate a comb of frequency components starting at 5 MHz, and separated by 100 kHz. The pulse train as defined would have frequency components from 100 kHz through the tens of MHz, and thus, would have a signal for every row in the transmitter. Thus, if the pulse train were passed through an identical filter bank to the one described above to detect sinusoids in the received column signals, then the filter bank outputs will each contain a single sinusoid that can be transmitted onto a row.

Fast Multi-Touch Post Processing

After the signal strengths from each row in each column have been calculated using, for example, the procedures described above, post-processing is performed to convert the resulting 2-D "heat map," also referred to as a "matrix," into usable touch events. In an embodiment, such post processing includes at least some of the following four procedures: field flattening, touch point detection, interpolation and touch point matching between frames. The field flattening procedure subtracts an offset level to remove crosstalk between rows and columns, and compensates for differences in amplitude between particular row/column combinations due to attenuation. The touch point detection procedure computes the coarse touch points by finding local maxima in the flattened signal. The interpolation procedure computes the fine touch points by fitting data associated with the coarse touch points to a paraboloid. The frame matching procedure matches the calculated touch points to each other across frames. Below, each of the four procedures is described in turn. Also disclosed are examples of implementation, possible failure modes, and consequences, for each processing step. Because of the requirement for very low latency, the processing steps should be optimized and parallelized.

The field flattening procedure is first described. Systematic issues due to the design of the touch surface and sensor electronics may cause artifacts in each column's received signal strength. In an embodiment, these artifacts may be compensated for as follows. First, because of cross-talk between the rows and columns, the received signal strength for each row/column combination will experience an offset level. To a good approximation, this offset level will be constant and can be subtracted (or added) off.

Second, the amplitude of the signal received at a column due to a calibrated touch at a given row and column intersection will depend on that particular row and column, mostly due to attenuation of the signals as they propagate along the row and column. The farther they travel, the more attenuation there will be, so columns farther from the transmitters and rows farther from the receivers will have lower signal strengths in the "heat map" than their counterparts. If the RF attenuation of the rows and columns is low, the signal strength differences may be negligible and little or no compensation will be necessary. If the attenuation is high, compensation may be necessary or may improve the sensitivity or quality of touch detection. Generally, the signal strengths measured at the receivers are expected to be linear with the amount of signal transmitted into the columns. Thus, in an embodiment, compensation will involve multiplying each location in the heat map by a calibration constant for that particular row/column combination. In an embodiment, measurements or estimates may be used to determine a heat map compensation table, which table can be similarly used to provide the compensation by multiplication. In an embodiment, a calibration operation is used to create a heat map compensation table. The term "heat map" as used herein does not require an actual map of heat, but rather the term can mean any array of at least two dimensions comprising data corresponding to locations.

In an embodiment, the entire field flattening procedure is as follows. With nothing touching the surface, first the signal strength for each row signal at each column receiver is measured. Because there are no touches, substantially the entire signal received is due to cross-talk. The value measured (e.g., the amount of each row's signal found on each column) is an offset level that needs to be subtracted from that position in the heat map. Then, with the constant offsets subtracted, a calibrated touch object is placed at row/column intersections and the signal strength of that row's signal at that column receiver is measured. In an embodiment, all row/column intersections are used for calibration. The signal processor may be configured to normalize the touch events to the value of one location on the touch surface. The location likely to have the strongest signals can be arbitrarily chosen (because it experiences the least attenuation), i.e., the row/column intersection closest to the transmitters and receivers. If the calibrated touch signal strength at this location is $S_N$ and the calibrated touch signal strength for each row and column is $S_{R,C}$ then, if each location in the heat map is multiplied by $(S_N/S_{R,C})$, all touch values will be normalized. In an embodiment, calibrated touches may cause the normalized signal strength for any row/column in the heat map to be equal to one.

The field flattening procedure parallelizes well. Once the offsets and normalization parameters are measured and stored—which should only need to be done once (or possibly again at a maintenance interval)—the corrections can be applied as soon as each signal strength is measured.

In an embodiment, calibrating each row/column intersection may be required at regular or selected maintenance intervals. In an embodiment, calibrating each row/column intersection may be required once per unit. In an embodiment, calibrating each row/column intersection may be required once per design. In an embodiment, and particularly where, e.g., RF attenuation of the rows and columns is low, calibrating each row/column intersection may not be required at all. Moreover, in an embodiment where the signal attenuation along the rows and columns is fairly predictable, it may be possible to calibrate an entire surface from only a few intersection measurements.

If a touch surface does experience a lot of attenuation, the field flattening procedure will, at least to some degree, normalize the measurements, but it may have some side effects. For example, the noise on each measurement will grow as its normalization constant gets larger. It will be apparent to one of skill in the art, that for lower signal strengths and higher attenuations, this may cause errors and instability in the touch point detection and interpolation processes. Accordingly, in an embodiment, sufficient signal strength is provided for the signal undergoing the largest attenuation (e.g., the farthest row/column intersection).

Touch point detection is now addressed, where one or more coarse touch points are identified. In an embodiment, after the heat map is generated and the field flattened, one or more coarse touch points can be identified. In an embodiment, identifying the one or more coarse touch points may be done by finding local maxima in the normalized (i.e., flattened) signal strengths. In an embodiment, a fast and parallelizable method for finding the one or more touch points compares each element of the normalized heat map to its neighbors and labels an element as a local maximum if it is strictly greater than all of them. In an embodiment, a point is identified as a local maximum if it is both strictly greater than all of its neighbors and above a given threshold.

It is within the scope of this disclosure to define the set of neighbors in various ways. In an embodiment, the nearest neighbors are defined by a Von Neumann neighborhood. In an embodiment, the nearest neighbors are defined by a Moore neighborhood. The Von Neumann neighborhood may consist of the four elements that are vertically and horizontally adjacent to the element in the center (i.e., the elements to the north, south, east and west of it). This is also called a "four-connected" neighborhood. More complex (i.e., larger) Von Neumann neighborhoods are also applicable and may be used. The Moore neighborhood consists of the eight elements that are vertically, horizontally and diagonally adjacent to the element in the center (i.e., the elements to the north, south, east, west, northeast, northwest, southeast and southwest of it). This is also called the "eight-connected" neighborhood.

The neighborhood chosen may depend on the interpolation scheme used to calculate the fine touch points. This is illustrated in further detail below.

In a given neighbor comparison, a special case may exist where an element's normalized signal strength is equal to one or more of its neighbors, strictly, or within a tolerance to allow for noise levels. In an embodiment, neither point in such pair is considered to be a touch point even if they have values above the threshold. In an embodiment, both points in such pair are considered to be touch points. In an embodiment, regions where two or more neighboring points have approximately the same value are treated as one touch event. In an embodiment, regions where two or more neighboring points have approximately the same value are treated as a different type of touch event (e.g., perhaps someone has their wrist in contact with the touch surface) from the regions where a single local maxima can be found.

Turning now to the interpolation procedure. Once the coarse touch points have been determined (i.e., identified), fine touch points can be computed using interpolation. In an embodiment, the capacitive contact of a distributed touch is fit to a model function having a maximum. In an embodiment, the model function is a second-order function in two or more dimensions. In an embodiment, the second-order function is a paraboloid. In an embodiment, the paraboloid model is an acceptable approximation for a variety of objects that may be used to touch a touch surface, such as a finger or stylus. Moreover, as discussed below, the paraboloid model is relatively non-intensive computationally. In an embodiment, a more complex or more computationally intensive model may be used to provide more accurate estimation of the touch from the flattened heat map. For the purposes of the discussion below, the paraboloid is used as an illustrative example, but as will be apparent to one of skill in the art in view of this disclosure, that other models, including models of greater or lesser complexity may be employed for the purpose of interpolation.

For such a four-connected, Von Neumann neighborhood around an exemplary local maximum, the relevant points would appear with the central element being the local maximum and the subscripts being the coordinates of a particular element relative to it. The positions and signal strengths of the five elements fit into the following equation defining a paraboloid:

$$Ax^2 + Cy^2 + Dx + Ey + F = z$$

Where x and y are the position of an element, z is the signal strength of the element, and A, C, D, E and F are the coefficients of the second-order polynomial. Relative to the central point, all of element x, y positions are constant. The z values are the measured signal strengths at each element, and thus are known. In an embodiment, five simultaneous equations can be used to solve for the five unknown polynomial coefficients. Each equation represents one of the five points, including the central point and its four neighbors.

In an embodiment, a Vandermonde-like matrix can be employed to solve for the polynomial coefficients, as follows:

$$\begin{bmatrix} x_{0,1}^2 & y_{0,1}^2 & x_{0,1} & y_{0,1} & 1 \\ x_{-1,0}^2 & y_{-1,0}^2 & x_{-1,0} & y_{-1,0} & 1 \\ x_{0,0}^2 & y_{0,0}^2 & x_{0,0} & y_{0,0} & 1 \\ x_{1,0}^2 & y_{1,0}^2 & x_{1,0} & y_{1,0} & 1 \\ x_{0,-1}^2 & y_{0,-1}^2 & x_{0,-1} & y_{0,-1} & 1 \end{bmatrix} \begin{bmatrix} A \\ C \\ D \\ E \\ F \end{bmatrix} = \begin{bmatrix} z_{0,1} \\ z_{-1,0} \\ z_{0,0} \\ z_{1,0} \\ z_{0,-1} \end{bmatrix}$$

Substituting in the values for the element positions, provides:

$$\begin{bmatrix} 0 & 1 & 0 & 1 & 1 \\ 1 & 0 & -1 & 0 & 1 \\ 0 & 0 & 0 & 0 & 1 \\ 1 & 0 & 1 & 0 & 1 \\ 0 & 1 & 0 & -1 & 1 \end{bmatrix} \begin{bmatrix} A \\ C \\ D \\ E \\ F \end{bmatrix} = \begin{bmatrix} z_{0,1} \\ z_{-1,0} \\ z_{0,0} \\ z_{1,0} \\ z_{0,-1} \end{bmatrix}$$

And then solve for the polynomial coefficients by inverting the constant Vandermonde-like matrix:

$$\begin{bmatrix} 0 & 1 & 0 & 1 & 1 \\ 1 & 0 & -1 & 0 & 1 \\ 0 & 0 & 0 & 0 & 1 \\ 1 & 0 & 1 & 0 & 1 \\ 0 & 1 & 0 & -1 & 1 \end{bmatrix}^{-1} = \frac{1}{2} \begin{bmatrix} 0 & 1 & -2 & 1 & 0 \\ 1 & 0 & -2 & 0 & 1 \\ 0 & -1 & 0 & 1 & 0 \\ 1 & 0 & 0 & 0 & -1 \\ 0 & 0 & 2 & 0 & 0 \end{bmatrix}$$

This yields:

$$\begin{bmatrix} A \\ C \\ D \\ E \\ F \end{bmatrix} = \frac{1}{2} \begin{bmatrix} 0 & 1 & -2 & 1 & 0 \\ 1 & 0 & -2 & 0 & 1 \\ 0 & -1 & 0 & 1 & 0 \\ 1 & 0 & 0 & 0 & -1 \\ 0 & 0 & 2 & 0 & 0 \end{bmatrix} \begin{bmatrix} z_{0,1} \\ z_{-1,0} \\ z_{0,0} \\ z_{1,0} \\ z_{0,-1} \end{bmatrix}$$

In an embodiment, the polynomial coefficients are a linear combination of the signal strengths and only simple multiplication, involving negation and a single shift, are required to calculate them; accordingly, they can be efficiently computed in an FPGA or ASIC.

At the maximum of the paraboloid, both partial derivatives are zero:

$$\frac{\partial x}{\partial z} = 2Ax + D = 0 \text{ and } \frac{\partial y}{\partial z} = 2Cy + E = 0$$

This will occur at the point $x_f$, $y_f$ where:

$$x_f = -\frac{D}{2A} \text{ and } y_f = -\frac{E}{2C}$$

Thus, in an embodiment where the neighborhood data is fit to a paraboloid, and because a paraboloid has one maximum, that maximum is used as a location of the fine touch point. In an embodiment utilizing the four-connected neighborhood, the values $x_f$ and $y_f$ are independent of each other, with $x_f$ depending only on the signal strengths of the elements to the left and right of the center point, and $y_f$ depending only on the signal strengths of the elements above and below it.

For a Moore or eight-connected neighborhood around a local maximum, the relevant points would appear with the central element being the local maximum and the subscripts being the coordinates of a particular element relative to it. The positions and signal strengths of the nine elements can be fit to a paraboloid equation. Because more input data is available in this example than the previous example, a somewhat more complex equation for a parabolid can be employed:

$$Ax^2 + Bxy + Cy^2 + Dx + Ey + F = z$$

This equation has an added xy cross term and a new B coefficient that permits the model to compensate for elongation in a direction other than x or y. Again, relative to the central point, all of the element x, y positions are constant and the z values are known. Nine simultaneous equations (one per element) can be used to determine (i.e., overdetermine) the six unknown polynomial coefficients. A least-squares technique may be used to solve for the six unknown polynomial coefficients.

A Vandermonde-like matrix may be used to fit the polynomial. Unlike the embodiment described above, the matrix is non-square, with nine rows and six columns.

$$\begin{bmatrix} x_{-1,1}^2 & xy_{-1,1} & y_{-1,1}^2 & x_{-1,1} & y_{-1,1} & 1 \\ x_{0,1}^2 & xy_{0,1} & y_{0,1}^2 & x_{0,1} & y_{0,1} & 1 \\ x_{1,1}^2 & xy_{1,1} & y_{1,1}^2 & x_{1,1} & y_{1,1} & 1 \\ x_{-1,0}^2 & xy_{-1,0} & y_{-1,0}^2 & x_{-1,0} & y_{-1,0} & 1 \\ x_{0,0}^2 & xy_{0,0} & y_{0,0}^2 & x_{0,0} & y_{0,0} & 1 \\ x_{1,0}^2 & xy_{1,0} & y_{1,0}^2 & x_{1,0} & y_{1,0} & 1 \\ x_{-1,-1}^2 & xy_{-1,-1} & y_{-1,-1}^2 & x_{-1,-1} & y_{-1,-1} & 1 \\ x_{0,-1}^2 & xy_{0,-1} & y_{0,-1}^2 & x_{0,-1} & y_{0,-1} & 1 \\ x_{1,-1}^2 & xy_{1,-1} & y_{1,-1}^2 & x_{1,-1} & y_{1,-1} & 1 \end{bmatrix} \begin{bmatrix} A \\ B \\ C \\ D \\ E \\ F \end{bmatrix} = \begin{bmatrix} z_{-1,1} \\ z_{0,1} \\ z_{1,1} \\ z_{-1,0} \\ z_{0,0} \\ z_{1,0} \\ z_{-1,-1} \\ z_{0,-1} \\ z_{1,-1} \end{bmatrix}$$

All of the entires in the Vandermonde-like matrix are constant, and the z values are known, thus substituting in the constant values, yields $$\begin{bmatrix} 1 & 1 & 1 & -1 & -1 & 1 \\ 0 & 0 & 1 & 0 & -1 & 1 \\ 1 & -1 & 1 & 1 & -1 & 1 \\ 1 & 0 & 0 & -1 & 0 & 1 \\ 0 & 0 & 0 & 0 & 0 & 1 \\ 1 & 0 & 0 & 1 & 0 & 1 \\ 1 & -1 & 1 & -1 & 1 & 1 \\ 0 & 0 & 1 & 0 & 1 & 1 \\ 1 & 1 & 1 & 1 & 1 & 1 \end{bmatrix} \begin{bmatrix} A \\ B \\ C \\ D \\ E \\ F \end{bmatrix} = \begin{bmatrix} z_{-1,1} \\ z_{0,1} \\ z_{1,1} \\ z_{-1,0} \\ z_{0,0} \\ z_{1,0} \\ z_{-1,-1} \\ z_{0,-1} \\ z_{1,-1} \end{bmatrix}$$

Because the Vandermonde-like matrix is non-square, it cannot be inverted to solve for the polynomial coefficients. It can be solved, however, using its Moore-Penrose pseudo-inverse and performing a least squares fit to the polynomial coefficients. In an embodiment, the pseudo inverse is defined as:

$$pinv(X) = (X^T X)^{-1} X^T$$

$$pinv \begin{bmatrix} 1 & 1 & 1 & -1 & -1 & 1 \\ 0 & 0 & 1 & 0 & -1 & 1 \\ 1 & -1 & 1 & 1 & -1 & 1 \\ 1 & 0 & 0 & -1 & 0 & 1 \\ 0 & 0 & 0 & 0 & 0 & 1 \\ 1 & 0 & 0 & 1 & 0 & 1 \\ 1 & -1 & 1 & -1 & 1 & 1 \\ 0 & 0 & 1 & 0 & 1 & 1 \\ 1 & 1 & 1 & 1 & 1 & 1 \end{bmatrix} =$$

$$\frac{1}{36} \begin{bmatrix} 6 & -12 & 6 & 6 & -12 & 6 & 6 & -12 & 6 \\ -9 & 0 & 9 & 0 & 0 & 0 & 9 & 0 & -9 \\ 6 & 6 & 6 & -12 & -12 & -12 & 6 & 6 & 6 \\ -6 & 0 & 6 & -6 & 0 & 6 & -6 & 0 & 6 \\ 6 & 6 & 6 & 0 & 0 & 0 & -6 & -6 & -6 \\ -4 & 8 & -4 & 8 & 20 & 8 & -4 & 8 & -4 \end{bmatrix}$$

giving $$\begin{bmatrix} A \\ B \\ C \\ D \\ E \\ F \end{bmatrix} =$$

$$\frac{1}{36} \begin{bmatrix} 6 & -12 & 6 & 6 & -12 & 6 & 6 & -12 & 6 \\ -9 & 0 & 9 & 0 & 0 & 0 & 9 & 0 & -9 \\ 6 & 6 & 6 & -12 & -12 & -12 & 6 & 6 & 6 \\ -6 & 0 & 6 & -6 & 0 & 6 & -6 & 0 & 6 \\ 6 & 6 & 6 & 0 & 0 & 0 & -6 & -6 & -6 \\ -4 & 8 & -4 & 8 & 20 & 8 & -4 & 8 & -4 \end{bmatrix} \begin{bmatrix} z_{-1,1} \\ z_{0,1} \\ z_{1,1} \\ z_{-1,0} \\ z_{0,0} \\ z_{1,0} \\ z_{-1,-1} \\ z_{0,-1} \\ z_{1,-1} \end{bmatrix}$$

The polynomial coefficients are a linear combination of the signal strengths. The multiplications are slightly more complicated, but many of the multiplicands can be factored out and applied a single time near the end of the calculation. The purpose of this step is to find the maximum of a paraboloid. Accordingly, overall scale factors are irrelevant, and focus need only be on relative values and arguments which maximize the function, in an embodiment, many of the operations may be canceled out, improving the efficiency of implementation.

As above, the fine touch point is presumed at the maximum of the paraboloid, where both partial derivatives are zero:

$$\frac{\partial x}{\partial z} = 2Ax + By + D = 0 \text{ and } \frac{\partial y}{\partial z} = Bx + 2Cy + E = 0$$

This will occur at the point $x_f$, $y_f$ where:

$$x_f = (BE-2CD)/(4AC-B^2) \text{ and } y_f = (DB-2AE)/(4AC-B^2)$$

For the eight-connected neighborhood, the values $x_f$ and $y_f$ are not independent of each other. Both depend on the signal strengths of all eight neighbors. Thus, this approach may have an increased computational burden and the possibility that certain combinations of signal strengths will produce singular values for the fine touch points. In an embodiment using the least-squares approach on the eight Moore neighbors, such an implementation is more robust against noisy signal strength values. In other words, in an embodiment, small errors in one signal strength will be compensated for by the increased amount of data used in the calculation, and the self-consistency of that data.

Moreover, the eight-connected neighborhood provides a B coefficient—an extra piece of information—that might prove useful as part of a user interface. The B coefficient of the xy cross-term can be used to characterize asymmetry in the fitted paraboloid and, along with the aspect ratio information inherent in the A and C coefficients, which could allow software to determine the angle at which a touch is occurring.

By way of example, a touch point with an elliptical cross section can be obtained by truncating the paraboloid at a particular z value. The values of a and b can be obtained from the A and C coefficients of the polynomial, and they provide information about the aspect ratio of the object touching the surface. For example, a finger or stylus would not necessarily be circularly symmetric, and the ratio of a to b could provide information about its shape.

Knowledge of the angle φ can provide information on the orientation of the ellipse, and might, for example, indicate which way a finger or stylus is pointing. φ can be calculated from the eigenvalues and eignevectors of the 2×2 matrix M given by the following:

$$M = \begin{bmatrix} A & B/2 \\ B/2 & C \end{bmatrix}$$

This matrix will have two eignevalues and two eigenvectors. The eigevector associated with the largest eigenvalue will point in the direction of the ellipse's major axis. The other eigenvector will point in the direction of the minor axis. The eigenvalues, $\lambda_1$ and $\lambda_2$ can be computed as follows:

$$\lambda_i = \frac{tr(M) \pm \sqrt{tr(M)^2 - 4\det(M)}}{2}$$

Where tr(M) is the trace of the matrix M, which is equal to AC, and det(M) is the determinant of the matrix M, which is equal to $AC-B^2/4$.

Once the eigenvalues are obtained, the Cayley-Hamilton theorem can be used to compute the eigenvectors. The eigenvector associated with $\lambda_1$ is either of the columns of the matrix $M-\lambda_2 I$ and the eigenvector associated with $\lambda_2$ is either of the columns of the matrix $M-\lambda_1 I$. Note the reversal of the eigenvalue indexes. The angle φ that the major axis of the ellipse makes with respect to the x axis of our coordinate system is the arctangent of the slope of the eigenvector. The slope of the eigenvector is just Δy/Δx.

As discussed above, the interpolation step requires determining a fine touch point, e.g., using data acquired from a flattened heat map, but it is not necessarily limited to the illustrative paraboloid model discussed above. The purpose of determining a fine touch point is to permit the post-processor to provide better granularity in touch points, and specifically, to provide granularity that exceeds the sensor's intersections. Stated another way, the modeled and interpolated fine touch point can land directly on a row/column intersection, or anywhere in between the intersections. There may be a tradeoff between the accuracy of the model and its computational requirements; similarly, there may be a tradeoff between the accuracy of the model and its ability to provide an interpolated fine touch point that corresponds with the actual touch. Thus, in an embodiment, a model is selected to require the smallest computational load while providing sufficient correspondence between the interpolated touch point and the actual touch. In an embodiment, a model is selected to require sufficient correspondence between the interpolated touch point and the actual touch, and the processing hardware is selected to accommodate the computational load of the model. In an embodiment, a model is selected that does not exceed the computational capacity of pre-selected hardware and/or other software operating the touch interface.

Turning to the frame matching procedure, to properly track objects moving on the touch surface over time, it is important to match the calculated touch points to each other across frame boundaries, and thus, e.g., to track objects moving on the touch surface as they move. Thus, in an embodiment, each calculated touch point in one frame should be identified in, or have another disposition (e.g., removed) in, the subsequent frame. While this represents a fundamentally difficult problem, which could be insoluble in the general case, in an embodiment, a solution is implemented using both geometry and the laws of physics. Because the items that are in contact with the touch surface are of finite size and move according to certain physical principles, in an embodiment, certain cases can be ignored as being outside of plausible ranges. Moreover, in an embodiment, a frame rate should be selected to be sufficiently high to permit object tracking (that is, frame-to-frame touch point tracking) with reasonable certainty. Thus, for example, where objects to be tracked are either known to move at a maximum rate across the touch surface or the tracking is designed to track the objects only up to a maximum rate, a frame rate can be selected that will permit tracking with reasonable certainty. For example, if a maximum rate of movement across the rows or columns of the touch surface is, e.g., 1000 rows or columns per second, then a frame rate of 1000 Hz will "see" an object move no more than 1 row or column per frame. In an embodiment, touch point interpolation (as discussed above) can provide a more precise measure of the touch point location, and thus, intra-row and intra-column positions are readily identifiable as described more fully herein.

Fingers and styluses have a minimum size and are, in most cases, unlikely to approach each other closely enough to cause an ambiguous case. They also travel at speeds characteristic of the motion of a human arm and its parts (e.g., wrist, elbow, fingers, etc.), which provides bounds. In an embodiment, a touch surface has an update rate on the order of one kilohertz or more, thus, fingers and styluses touching the surface cannot move very far or at extreme angles during the update period from one frame to the next. Because of the limited distances and angles, tracking can be performed according to the present disclosure by comparing data from one frame to one or more past frames.

In an embodiment, data concerning past frames (e.g., a heat map) may be maintained in a temporary buffer. In an embodiment, processed data concerning past frames (e.g., field flattened heat map or fitted polynomial coefficients) may be maintained in a temporary buffer. In an embodiment, the data concerning a past frame that is maintained in a temporary buffer may include, or may consist of, an interpolated fine touch point coordinate for each fine touch point in the prior frame, and, to the extent such exists, vectors concerning prior motion of those fine touch points. The temporary buffer may retain data concerning one or more past frames, and may cease to retain the data when it is no longer relevant to later calculations.

In an embodiment, the frame matching process initially presumes that an object's touch point in the current frame i is probably the touch point in the prior frame (i.e., i−1) which is geometrically closest to it.

In an embodiment, data concerning the motion of a touch point (e.g., velocity and direction) are determined and stored in connection with one or more frames. In an embodiment, data concerning the motion of a touch point is used to predict a likely location for that touch point in the next frame. Data concerning the motion of a touch point may comprise, for example, velocity or change in position, and may come from one or more prior frames. In an embodiment, predicting a likely location in a frame is done by considering the motion between two frames—yielding a per-frame displacement and its direction. In an embodiment, predicting a likely location in a frame is done by considering the motion in three or more frames. Using fine touch point positional information from three or more frames may yield a more precise prediction as it can take into account acceleration and changes of direction in addition to per-frame displacement and direction. In an embodiment, more weight is assigned to more recent frame data than to older frame data. A frame matching process may initially presume that an object's touch point in the current frame i is more likely to correspond with the touch point in the prior frame (i.e., i−1) that is associated with the predicted likely location closest to the touch point in the current frame.

In an embodiment, data concerning the size (magnitude) of a touch point (e.g., the A and C coefficients of a paraboloid) is determined and stored in connection with one or more frames. A frame matching process may initially presume that the size of a given object in the current frame i probably corresponds with the size of that object in the prior frame (i.e., i−1).

In an embodiment, data concerning the change in size (magnitude) of a touch point over time are determined and stored in connection with one or more frames. In an embodiment, data concerning the change in size of a touch point in a frame (e.g., since the last frame, or over a plurality of frames) is used to predict a likely size for that touch point in the next frame. A frame matching process may initially presume that an object in the current frame i is more likely to correspond with an object in the prior frame (i.e., i−1) that is associated with the predicted likely size nearest the size of the touch point in the current frame.

In an embodiment, data concerning the change in rotational orientation (e.g., the B coefficient of a paraboloid) of a touch point over time are determined and stored in connection with one or more frames. In an embodiment, data concerning the rotational orientation of a touch point in a frame (e.g., since the last frame, or over a plurality of frames) is used to predict a rotational orientation for that touch point in the next frame. A frame matching process may initially presume that an object in the current frame i is more likely to correspond with an object in the prior frame (i.e., i−1) that is associated with the predicted likely rotational orientation nearest the rotational orientation of the touch point in the current frame. In an embodiment, the rotational orientation of a touch point could permit single touch point control (e.g., single finger control) of rotation, thus, for example, the rotation of one finger on a screen could provide sufficient information to, for example, rotate a view—a function that traditionally requires two rotating points of contact with a touch surface. Using data describing rotational orientation over time, rotational velocity can be computed. Similarly, data concerning rotational orientation or rotational velocity can be used to compute rotational acceleration. Thus, rotational velocity and rotational acceleration both utilize rotational orientation. Rotational orientation, rotational velocity and/or rotational acceleration may be computed for a touch point and output by or used by the frame matching process.

In an embodiment, heuristics for frame matching include changes in distance and in the velocity vectors of the touch points. In an embodiment, heuristics for frame matching include, without limitation, one or more of the following:

an object's touch point in frame i+1 is more likely the touch point in frame i which is geometrically closest to it;

an object's touch point in frame i+1 is more likely the touch point in frame i which is closest to the point where it would be predicted to be given the object's velocity history; and an object's touch point in frame i+1 is more likely of a similar size to its touch point in frame i.

Other combinations of historical data may be used without departing from the scope of this disclosure. In an embodiment, both prior positions and the velocity histories may be used in a heuristic frame matching process. In an embodiment, prior positions, the velocity histories and size histories may be used in a heuristic frame matching process. In an embodiment, prior positions and other historical information may be used in a heuristic frame matching process. In an embodiment, historical information over a plurality of frames is used in a heuristic frame matching process. Other combinations will be apparent to one of skill in the art in view of the foregoing disclosure.

In U.S. patent application Ser. No. 14/216,791, filed Mar. 17, 2014, entitled "Fast Multi-Touch Noise Reduction," methods and systems are provided to overcome certain conditions in which noise produces interference with, or phantom touches in, the Fast Multi-Touch (FMT) sensor. The entire disclosure of this application is incorporated herein by reference. In an embodiment, unique signals may be transmitted on all rows and columns. In an embodiment, unique signals may be transmitted on each row in one or more subsets of rows. In an embodiment, unique signals may be transmitted on each column in one or more subsets of columns. In an embodiment, all rows and columns are configured to detect the unique signals. In an embodiment, each row in one or more subsets of rows is configured to detect the unique signals. In an embodiment, each column in one or more subsets of columns is configured to detect the unique signals.

As disclosed in U.S. patent application Ser. No. 14/603,104, filed Jan. 22, 2015, entitled "Dynamic Assignment of Possible Channels in a Touch Sensor," a system and method enables a touch sensor to reduce or eliminate such false or noisy readings and maintain a high signal-to-noise ratio, even if it is proximate to interfering electromagnetic noise from other computer system components or unwanted external signals. This method can also be used to dynamically reconfigure the signal modulation scheme governing select portions or the entire surface-area of a touch sensor at a given point in time in order to lower the sensor's total power consumption, while still optimizing the sensor's overall performance in terms of parallelism, latency, sample-rate, dynamic range, sensing granularity, etc. The entire disclosure of the application is incorporated herein by reference.

Keyboard Embodiment

Use of physical keyboards in virtual reality or augmented reality (hereinafter, "VR/AR," even though the two terms can be mutually exclusive) settings is complicated by the fact that a user may not have any view, or a full view, of the keyboard when within the VR/AR setting. The keyboard and keyboard switches disclosed herein render one or more keys, a touch surface, or a keyboard into a sensitive, dynamic, hover, contact and pressure sensitive surface that can be used for both traditional keyboard or keying applications, as well as numerous new applications enabled by the additional information available from the keys or surfaces. In an embodiment, a physical keyboard is described that can sense not only the traditional keyboard inputs, but may be able to distinguish finger-key contact and finger hover, thus enabling determination of the respective positions of a user's fingers, hands, wrists and potentially forearms when the keyboard is being used. In an embodiment, the keyboard data is used to reconstruct the position and orientation of the user's fingers, hands, wrists, forearms, and potentially, the keyboard (including changes to the keyboard such as the addition of key-top or side labels, or e.g., tool tips) in a VR/AR setting. Such reconstruction allows the user to "see" his or her fingers, hands, wrists and possibly forearms relative to the keyboard VR/AR settings, making the use of a keyboard possible in VR/AR settings.

Turning first to FIGS. 1A-1D, an illustrative embodiment of a keyboard switch 110 is shown. In an embodiment, key base 100 supports the other elements of the keyboard switch 110. In an embodiment, key cover 101 is provided in movable relation to the key base 100. In an embodiment, key cover 101 is only partially movable with respect to the key base 100. In an embodiment, a biasing means (not shown) urges key cover 101 to its extended position when at rest, and as is apparent to those of skill in the art, key cover 101 moves in a direction roughly normal to its upper surface.

In an embodiment, two antennae 102, 103 are associated with the keyboard switch 110, one of the two antennae being a receive antenna 103, and the other being a transmit antenna 102. The designation of transmit or receive is arbitrary, except that in an embodiment, at least one of each is associated with the keyboard switch. The two antennae 102, 103 are spaced apart from one another such that no portion of transmit antenna 102 touches any portion of receive antenna 103. In an embodiment, keyboard switch 110 shares its antennae 102, 103 with one or more other keys. In an embodiment, keyboard switch 110 comprises one unique antenna, and shares its other antenna with one or more other keys. As will be discussed more fully below, keyboard switch 110 may be a sole keyboard switch, or more commonly, may be used with a plurality of other keyboard switches in a keyboard.

In an embodiment, one antenna is a transmit antenna 102 and the other antenna is a receive antenna 103. In an embodiment, a keyboard switch 110 may have one or more additional transmit antennae (not shown). In an embodiment, a keyboard switch 110 may have one or more additional receive antennae (not shown). Each of the antennae associated with any keyboard switch 110 is spaced apart from each other antennae such that no portion of any of the antennae touches any portion of any other antennae.

Although shown in an exemplary embodiment on the front and back sides of the key base 100, the antennae may be placed as will best suit the intended application. For example, in varying embodiments, 1) a transmit antenna is placed on one side of the key, and a receive antennae on the other side;
2) a transmit antenna is placed within the key base, and a receive antenna rings around the key base;
3) transmit antennae are placed on each side of the key base, and a receive antenna is placed in the center of the key base;
4) receive antennae are placed on each side of the key base, and a transmit antenna is placed in the center of the key base; or
5) transmit antennae are placed on each side of the key base, and receive antennae are placed on the front and rear of the key base.

Many other configurations will be apparent to a person of skill in the art in view of this disclosure, and can be made without departing from the spirit and scope of the inventions claimed herein.

In an embodiment, the antennae 102, 103 are fixed, and do not move relative to one another when the key cover 101 is moved or depressed. In an embodiment, at least one of antennae 102, 103 can move relative to the other. In an embodiment, at least one of antennae 102, 103 moves relative to the other when key cover 101 is moved or depressed. Movement (or lack of movement) of the antennae may result in a differing response to the key press than where the antennae are stationary. As will be appreciated by a person of skill in the art, where the pressure or level of key press requires substantial granularity—that is, a very sensitive measure of how much the key cover 101 is pressed—it may be desirable to have at least one of the antenna 102, 103 move as a result of that key cover 101 press. One or more antennae moving in response to the movement of the key cover 101 is also desirable where the object pressing the key has limited capacitive implication (e.g., typing using long fingernails, typing with gloves on, typing with a pencil or other object, typing underwater, etc.).

In an embodiment, a transmit antennae 102 is associated with a signal emitter (not shown). In an embodiment, the antennae 102, 103 form a touch sensor when a signal is transmitted onto the transmit antenna 102 and a receiver (not shown) receives the signals present on a receive antenna 103. In an embodiment, a signal processor (not shown) is used to determine an amount, and/or changes in the amount, of the signal transmitted onto the transmit antenna 102 that is present in the signals on the receive antenna 103. In an embodiment, the transmit antenna 102 and receive antenna 103 are designed so that, when they are not subject to a touch event, one amount of signal is coupled between them, whereas, when they are subject to a touch event, another amount of signal is coupled between them. Moreover, in an embodiment, the transmit antenna 102 and receive antenna 103 are designed so that the amount of signal coupled between them varies with the various touch events, from the farthest hover, through key contact, and all the way to a fully depressed key. In an embodiment, the variation in signal from the farthest hover to a fully depressed key comprises a range of detectable touch states, which may comprise at least three touch states (i.e., hover, contact and depressed) in addition to an untouched state. In an embodiment, the variation in signal representing the hover touch state comprise a plurality of discrete levels. In an embodiment, the variation in signal representing the contact touch state comprise a plurality of discrete levels. In an embodiment, the variation in signal from the farthest hover to a fully depressed key comprises a range of detectable touch states, which comprises at least 255 or more touch states in addition to an untouched state. As discussed above, because the touch sensor ultimately detects touch due to a change in the coupling, it is not of specific importance, except for reasons that may otherwise be apparent to a particular embodiment, whether the touch-related coupling causes an increase in the amount of signal present on the receive antenna 103 or a decrease in the amount of signal present on the receive antenna 103.

To identify touch, the receiver receives signals present on the receive antenna 103 and a signal processor analyzes the received signal to determine the amount of the coupled transmitted signal. In an embodiment, the identification can be supported with a frequency analysis technique (e.g., Fourier transform), or by using a filter bank. In an embodiment, the receiver receives a frame of signals, which frame is processed through an FFT, and thus, a measure is determined for at least the transmitted frequency. In an embodiment, the FFT provides an in-phase and quadrature measure for at least the transmit frequency, for each frame.

In an embodiment, a signal emitter is conductively coupled to transmit antenna 102 for the keyboard switch 110. The signal emitter emits a source signal causing the transmit antenna 102 associated therewith to transmit the source signals. The source signal may be a combination of e.g., other signals, thus, for example, while the source signal could be a simple sine wave (e.g., 5.01 Mhz), it is also within the scope of this disclosure that the source signal is a combination of two or more sine waves. In an embodiment, more than one signal emitters may be conductively coupled to transmit antenna 102 for the keyboard switch 110. Where more than one signal emitters are conductively coupled to a transmit antenna 102, the output of the more than one signal emitters provide the signals transmitted by the transmit antenna 102. In an embodiment, transmission of multiple source signals may increase sensitivity. In an embodiment, transmission of multiple source signals may increase sensitivity further if high and low frequency signals are combined. In an embodiment, the source signals are frequency-orthogonal. As previously used herein, frequency-orthogonal means that the source signals are separable and distinguishable from each other. In an embodiment, the receiver is coupled to the receive antenna 103, and adapted to capture a frame of signals present on the coupled receive antenna 103. Where another receive antenna (not shown) is associated with the keyboard switch 110, the additional receive antenna may share the same receiver (and thus, as would be apparent to one of skill in the art, could be considered different parts of the same antenna), or alternatively, may be conductively coupled to a separate receiver.

In an embodiment, multiple orthogonal signals are transmitted over the transmit antenna 102. To identify touch in such embodiment, the receiver receives signals present on the receive antenna 103 and a signal processor analyzes the received signals to determine an amount corresponding to each of the orthogonal transmitted signal coupled between them. The identification can be supported with a frequency analysis technique (e.g., Fourier transform), or by using a filter bank. In an embodiment, the receiver receives a frame of signals, which frame is processed through an FFT, and thus, a measure is determined for each transmitted frequency. In an embodiment, the FFT provides an in-phase and quadrature measure for each transmit frequency, for each frame.

In an embodiment, from the received signal, the receiver/signal processor can determine a value (and in an embodiment an in-phase and quadrature value) for each frequency, from a list of frequencies, found in the signal received on that receive antenna 103. In an embodiment, where the value corresponding to a frequency is greater or lower than some threshold, or changes from a prior value (or changes from a prior value by an amount greater than a threshold), that information may be used to identify a touch event at the keyboard switch 110. In an embodiment, the value information, which may correspond to various physical phenomena including the distance of the touch from the keyboard switch 110, the size of the touch object, the pressure with which the object is pressing on the keyboard switch, any fraction of key cover 101 that is being touched, etc., may be used to identify the touch state from the range of detectable touch states. In an embodiment, changes in the value information may be used to identify the touch state from the range of detectable touch states. In an embodiment, the determined values are not self-determinative of touch state, but rather are further processed along with other values to determine touch states. In an embodiment, the determined values are further processed along with values from other keyboard switches proximate to the keyboard switch 110 to determine the touch state of the keyboard switch 110.

In an embodiment, antennae 102, 103 associated with a keyboard switch 110 are shaped similarly. In an embodiment, antennae 102, 103 associated with a keyboard switch 110 are shaped differently. The different shaped antennae 102, 103 produce different antennae patterns based on the shape of the antennae 102, 103. As will be apparent to a person of skill in the art in view of this disclosure, antennae 102, 103 associated with a keyboard switch 110 may be oriented in different spatial orientations to produce differing antennae patterns. In an embodiment, each respective transmit and receive antennae 102, 103 is associated with a transmission or reception layer, thereby resulting in a multi-layer construction of the keyboard switch 110.

In an embodiment, a signal processor is adapted to determine a measurement from each frame corresponding to an amount of the source signals present on the receive antenna 103. In an embodiment, the signal processor is further adapted to determine a keyboard switch touch state from the range of touch states, based at least in part on the corresponding measurement.

The keyboard switch 110 may be a sole keyboard switch, or more commonly, may be used with a plurality of other keyboard switches in a keyboard (not shown). In an embodiment, a keyboard is composed of a collection of keyboard switches 110. In an embodiment, keyboard switches 110 are organized into logical rows and logical columns such that each of the plurality of keyboard switches is associated with, and uniquely identified by, one row and one column. In an embodiment, keyboard switches 110 may be organized into logical rows and logical columns such that each of the plurality of keyboard switches are associated with, and uniquely identified by, at least one row and one column.

In an embodiment, no two keyboard switches in a keyboard may share a common row/column combination, thus, the keyboard can detect a measure that is unique to a respective keyboard switch 110. In an embodiment, each keyboard switch 110 operates as a proximity sensor by transmitting a signal over an antenna 102 and receiving coupled signal on the another antenna 103. As discussed above, for each keyboard switch 110 a value associated with touch at that keyboard switch 110 may be derived from the amount, or a change in the amount, of the transmitted signal found in the coupled signal. The value may be correlated with one of a range of touch states. In an embodiment, the range of touch states include no hover, hover, contact, and pressed or depressed. In an embodiment, "no hover" means there is no detection of the user's fingers, hand, or forearm in the vicinity of the keyboard switch 110. As used here, generally, "hover" refers to a touch state corresponding to detectable location of a capacitive object (e.g., user's fingers, hands, forearm or stylus) from the limit of detection of the keyboard switch through but not including include actual contact with the keyboard switch or keyboard. As used here, generally, "contact" refers to a touch state corresponding to a detectable contact between the keyboard switch or keyboard and the capacitive object, all the way through being pressed. Being pressed, or depressed corresponds with the traditional notion of a key being closed, e.g., when a corresponding character would be put on the screen. As used here, however, "depressed" or "pressed" refers to a touch state corresponding to the detection of a fully depressed key, and may also include various additional states corresponding to the pressure on the key after being fully depressed. In an embodiment, the touch states may use an ordinal scale, e.g., from 0 to 255, with zero corresponding to a no touch state, a first range, e.g., 1 to 127 corresponding to various hover states, a second range, e.g., 128-197 corresponding to various contact states, and a third range, e.g., 198-255 corresponding to a range of pressed states. In an embodiment, the range of touch states comprises at least four states. In an embodiment, the range of touch states comprises at least 6 states, with at least two substrates corresponding to hover and contact. In an embodiment, the range of touch states comprises at least 256 states, with at least three substrates corresponding to hover, contact and pressed. In an embodiment, the range of touch states comprises at least 1024 states. As will be apparent to a person of skill in the art in view of this disclosure, the number of touch states and association between those states and any substrates are design choices and should be selected to provide the desired granularity for the keyboard switch. Moreover, it is not necessary for substrates to have equal granularity with other substrates. For example, in an embodiment, it may be desirable (as discussed in more detail in connection with FIG. 4), to have more granularity on the contact states or on the division between the hover state and the contact state. Similarly, in an embodiment, it may be more desirable to have additional granularity on hover states or pressed states.

In an embodiment, using these states, the keyboard switches 110 on the keyboard can provide granular, multi-level information relative to user's fingers on (and potentially between) the respective keyboard switches 110. For example, in an embodiment, as the key cover 101 is depressed, the keyboard may detect a change in the surface area of the key in contact with the finger. Further, in an embodiment, as the key is depressed the key cover 101 is closer to the conductor, and thus, both the change in the surface area and the proximity of the capacitive object to the conductor may result in capacitive change, which provides information relative to the user's finger on the keyboard switches.

Figure 2A:
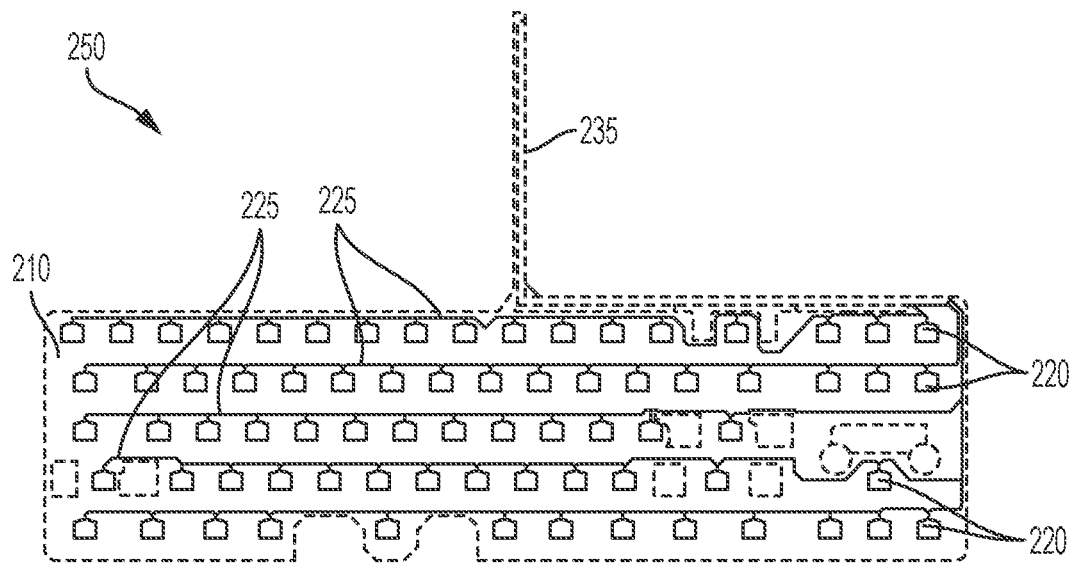
FIGS. 2A and 2B show exemplary transmission and reception layers of a keyboard using the exemplary keyboard switch shown in FIG. 1.
Figure 2B:
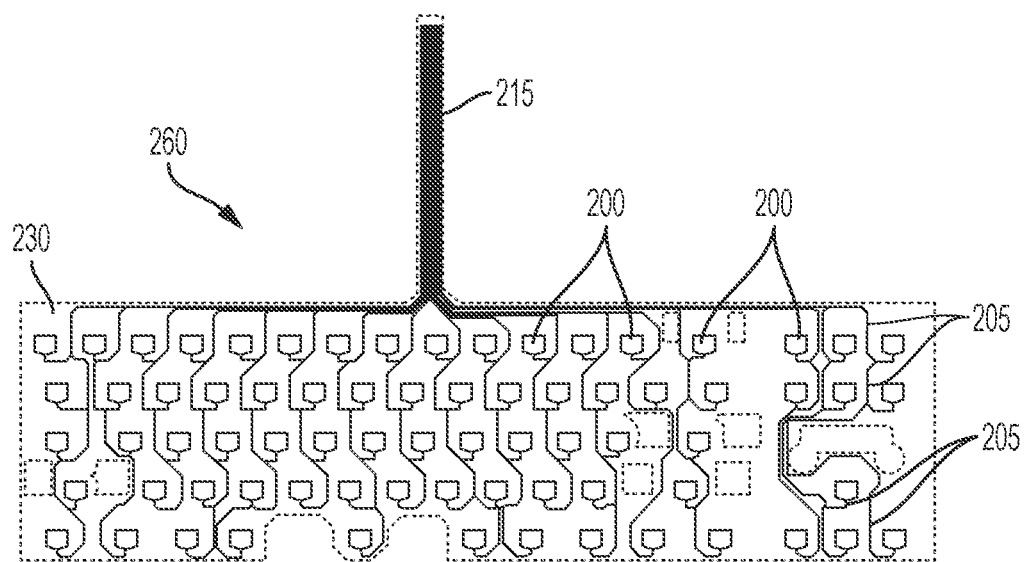

FIGS. 2A and 2B show antennae layers for an embodiment of an exemplary typical keyboard. FIG. 2A shows an exemplary illustration of conductively coupled columns (shown horizontally) of a plurality of transmit antennae 220. (The designation of rows and columns being arbitrary.) Transmit traces 225 are traced along the transmit layer 210 connect groups of transmit antennae 220 together, and bundle together at bundle 235. FIG. 2B shows an exemplary illustration of a plurality of receive antennae 200 organized into conductively coupled rows (shown vertically). Receive traces 205 are traced along the receive layer 230, to a bundle 215. Antenna layers 250, 260 are separated and stacked in a keyboard (not shown) having a plurality of key bases (not shown), each of the bases having a key cover (not shown). In an embodiment, the antennae 220, 200 form the transmit antenna 102 and receive antenna 103 (see, e.g., FIG. 1B) of each keyboard switch (not shown).

In an embodiment, a signal emitter (not shown) is conductively coupled with each transmit trace 225, and via the emitters, a plurality of signals are transmitted over each of the transmit antenna 220 rows, respectively. In an embodiment, each of the plurality of signals is orthogonal to each of the other plurality of signals. In an embodiment, the plurality of signals are simultaneously transmitted over each of the transmit antenna 102.

A receiver (not shown) is conductively coupled with each of the receive traces 205. The receiver and/or a signal processor (not shown) associated therewith is adapted to receive frames of signals present on the receive traces 205 (i.e., coming from the receive antennae 200) and from the frame, to determine a value for each of the plurality of signals transmitted over each of the transmit antenna 102. In an embodiment, each value is correlated with one of a range of touch states, and all of the values together, producing a keyboard state. In an embodiment, each keyboard switch in the keyboard is associated with one of a range of touch states, and that association is computed based at least in part on the value associated with that keyboard switch. In an embodiment, the association is computed based, at least in part, on the value associated with that keyboard switch, and the value associated with at least one neighboring keyboard switch.

Determination of value for each of the plurality of signals are transmitted over each of the transmit antenna 102 can be supported with a frequency analysis technique (e.g., Fourier transform), or by using a filter bank. In an embodiment, the receiver receives a frame of signals, which frame is processed through an FFT, and thus, a measure is determined for each transmitted frequency. In an embodiment, the FFT provides an in-phase and quadrature measure for each transmit frequency, for each frame.

While at least one of the plurality of signals sent via the transmitters are sent via each transmit antenna 102, in an embodiment, at least one transmit antenna 102 simultaneously transmits a second one of the plurality of signals. In an embodiment, a plurality of orthogonal signals are simultaneously transmitted such that at least two of the orthogonal signals are simultaneously transmitted over each transmit antenna 102. In an embodiment, simultaneous transmission of multiple signals over a single transmit antenna may increase sensitivity. In an embodiment, frequency-distant orthogonal signals are simultaneously transmitted over a single transmit antenna 102.

Turning to FIGS. 3-6, several additional, exemplary embodiments of a keyboard switch are shown. As with the keyboard switch 110 shown in FIG. 1, the keyboard switches shown in FIGS. 3-6 can be used alone or as part of a keypad or keyboard. While the keyboard switches disclosed in FIGS. 3-6 can be used in many types of keyboards, they are particularly useful in the design of non-traditional keyboards, e.g., thinner keyboards such as "chicklet" (or island style) keyboards and membrane keyboards. The keyboard switches disclosed in FIGS. 3-5 are shown with a single transmit antenna and a single receive antenna. Without departing from the spirit and scope of this disclosure, these keyboard switches can have one or more additional transmit antennae and/or one or more additional receive antenna. For example, as discussed in more detail below, FIG. 6 shows an embodiment having two transmit antennae.

As with the previously discussed keyboard switch 110 illustrated in FIG. 1, in an embodiment, the keyboard switches disclosed in FIGS. 3-5 each transmit a single frequency over its transmit antenna. Also as with the previously discussed keyboard switch illustrated in FIG. 1, in an embodiment, the keyboard switches disclosed in FIGS. 3-5 each transmit a plurality of orthogonal signals over its transmit antenna. The keyboard switch illustrated in FIG. 6 having two transmit antennae, may similarly be used with a single transmit frequency, or with multiple, simultaneous, orthogonal transmit frequencies.

FIG. 3A shows an illustrative orientation of antennae components 310 of a keyboard switch comprising a transmit antenna 300 and transmit trace 301 conductively coupled thereto, as well as receive antenna 302 and receive trace 303 conductively coupled thereto. As will be understood by a person of skill in the art, the designation of transmit and receive here are arbitrary, and the transmit antenna 300 could be used to receive, while the receive antenna 302 could be used to transmit; these arbitrary designations are merely a convenience for illustrative purposes. In an embodiment, a signal emitter (not shown) emits one or more signals for transmission on the transmit antenna 300 via the transmit trace 301, and a receiver (not shown) receives a frame of signal present on the receive antenna 302 via the receive trace 303. A signal processor (not shown) analyzes the frame to determine a value corresponding to an amount of the one or more signals transmitted on the transmit antenna 300. The value (or a change in the value) may be correlated with one of a range of touch states. FIG. 3B shows a schematic view of a keyboard switch 311 using the illustrative orientation of antennae components 310 in FIG. 3A. Keyboard switch 311 comprises a key cover 305 that covers the antennae components 310. In an embodiment, a user can interact with the key cover 305 as the key of a keyboard. In an embodiment, key cover 305 has a biasing means (not shown), such as a spring, that biases it towards a home position away from antennae components 310. In an embodiment, key cover 305 is made from a deformable memory material that itself will return to a home shape away from antennae components 310.

As discussed in detail above, in an embodiment, a capacitive object, including, e.g., a user's hand or finger, or a stylus, is detected by a touch detector formed using the antennae 300, 302, and one of a range of touch states may thereby be associated with the keyboard switch 311. Also as discussed above, in an embodiment, the keyboard switch 311 is suitable for use in a keyboard. In an embodiment, rows and columns are associated with each of a matrix of keyboard switches. In an embodiment, the touch state of the key may be determined, at least in part, based on information detected by the touch detector formed using the antennae 300, 302, or changes in that information. In an embodiment, the touch state of the keyboard switch may be determined, at least in part, based on information detected (or changes in information detected) by the antennae of another proximate keyboard switch.

FIG. 4A shows an illustrative orientation of antennae components 410 of a keyboard switch having a transmit antenna 300 and transmit trace 301 conductively coupled thereto, as well as receive antenna 302 and receive trace 303 conductively coupled thereto. Conductive substrate 404 is also shown. As above, the designation of transmit and receive are arbitrary. In an embodiment, a signal emitter (not shown) emits one or more signals for transmission on the transmit antenna 300 via the transmit trace 301, and a receiver (not shown) receives a frame of signal present on the receive antenna 302 via the receive trace 303. A signal processor (not shown) analyzes the frame to determine a value corresponding to an amount of the one or more signals transmitted on the transmit antenna 300. The value (or a change in value) may be correlated with one of a range of touch states.

Turning now to FIG. 4B a schematic view of a keyboard switch 411 using the illustrative orientation of antennae components 410 in FIG. 4A. Keyboard switch 411 comprises a key cover 405 that covers the antennae components 410. In an embodiment, key cover 405 has a biasing means (not shown) that biases it towards a home position when it is not being contacted. In an embodiment, the biasing means may be a spring. In an embodiment, the biasing means may comprise a flexible deformable key cover. A conductive substrate 404 is positioned at the underside of the key cover 405. In an embodiment, the conductive substrate 404 is adapted to move in unison with at least a portion of the upper surface of the key cover 405. In an embodiment, the conductive substrate 404 may act to magnify the capacitive effect of a capacitive object brought into contact therewith. In an embodiment, the conductive substrate 404 causes a more measurable response from the touch detector in the transition between the touch states of hover and contact. In an embodiment, the conductive substrate 404 may be used to enhance the measurable range of touch states when a capacitive object is in contact with the key cover 405, thus, improving the granularity of the measurable states in the touch sensor. In an embodiment, the conductive substrate 404 is a solid conductive material. In an embodiment, the conductive substrate 404 is conductive mesh material. In an embodiment, conductive properties of conductive substrate 404 differ from the conductive properties of key cover 405. In an embodiment, conductive substrate 404 is affixed to key cover 405 using a gluing process. In an embodiment, the conductive substrate 404 is affixed to key cover 405 so that a conductive portion of the conductive substrate 404 protrudes through key cover 405 and may be contacted directly by a capacitive object. In an embodiment, conductive substrate 404 and key cover 405 are formed from the same material, conductive substrate 404 having a greater thickness than the upper portion of key cover 405. In an embodiment, conductive substrate 404 and key cover 405 are molded as a single object. Keyboard switch 411 can be used in the same manner as keyboard switch 311, however, the addition of the capacitive substrate 404 may enhance the detection of contact, and may provide better measurable granularity among contact touch states.

Turning now to FIG. 5 another embodiment of a keyboard switch 511 is shown in a schematic cutaway view. Keyboard switch 511 comprises many common components with keyboard switch 411 (FIG. 4B), including transmit antenna 300, transmit trace 301, receive antenna 302, receive trace 303, as well as key cover 405 and conductive substrate 404. Keyboard switch 511 is also operated similarly to keyboard switch 411 using a signal emitter (not shown) and receiver (not shown). Keyboard switch 511 further comprises a conductive coupling 506 between conductive substrate 404 and transmit antenna 300. In an embodiment, the conductive coupling may form the biasing means, such as a spring (e.g., a coil spring or a leaf spring), that urges key cover 405 to a home position. The conductive coupling 506 between conductive substrate 404 and transmit antenna 300 causes conductive substrate 404 to operate as a further antenna for transmission of transmit signals. In an embodiment, transmit antenna 300, conductive substrate 404 and conductive coupling 506, together, form a single, moveable antenna that can be used to transmit the transmit signals (or receive the signals if attached to a receiver).

FIG. 6 shows a schematic cutaway view of an embodiment of yet another keyboard switch 611, this one having two transmit antennae (or two receive antennae). Keyboard switch 611 comprises many common components with keyboard switch 411 (FIG. 4B), including transmit antenna 300, transmit trace 301, receive antenna 302, receive trace 303, as well as key cover 405 and conductive substrate 404. To the extent of its common components, keyboard switch 611 is operated similarly to keyboard switch 411 using a signal emitter (not shown) and receiver (not shown). Keyboard switch 611 further comprises a conductive lead 606 conductively coupled to conductive substrate 404. A further signal emitter (not shown) is conductively coupled to the conductive lead 606. The further signal emitter emits one or more further signals for transmission on the conductive substrate 404. In an embodiment, the one or more further signals are orthogonal to the one or more signals transmitted on the transmit antenna 300. The signal processor (not shown) also analyzes the frame of signals received by receiver, to determine a further value corresponding to an amount of the one or more further signals transmitted on the conductive substrate 404. In an embodiment, the further value (or a change in the further value) may be correlated with one of a range of touch states. In an embodiment, the value (corresponding to the one or more signals) and the further value (corresponding to the one or more further signals) are both used as a basis for identification of a touch state associated with the keyboard switch. As in other embodiments, the values (and further values) from neighboring or proximate keys may additionally be used as at least part of the basis for identifying a touch state associated with the keyboard switch. Without departing from the spirit and scope of this disclosure, instead of having two transmit antennae and one receive antenna, the keyboard switch 611 can have two receive antennae and one transmit antenna.

In an embodiment, the range of touch states provided by the various keyboard switches in a keyboard can be used to model a capacitive object and its position and orientation with respect to the keyboard. In an embodiment, such modeling can be used to provide visual feedback, including a visual 3-D model of the capacitive object, in a VR/AR setting. For example, an overlay of 2-D and 3-D "holographic" visual feedback in VR/AR settings can be based on the real-world positions of the user's fingers, hands, wrists and forearms on or in proximity to a physical keyboard made of touch detecting keyboard switches. Further, because the keyboard can make fine measurements of the location of capacitive objects relative to a keyboard, the touch measurements can be used to recreate the location and orientation of fingers, hands and possibly other parts including wrists and/or forearms because there are a limited number of ways in which a hand and forearm can move relative to the fingers—e.g., finite ranges and degrees of freedom.

Figure 7:
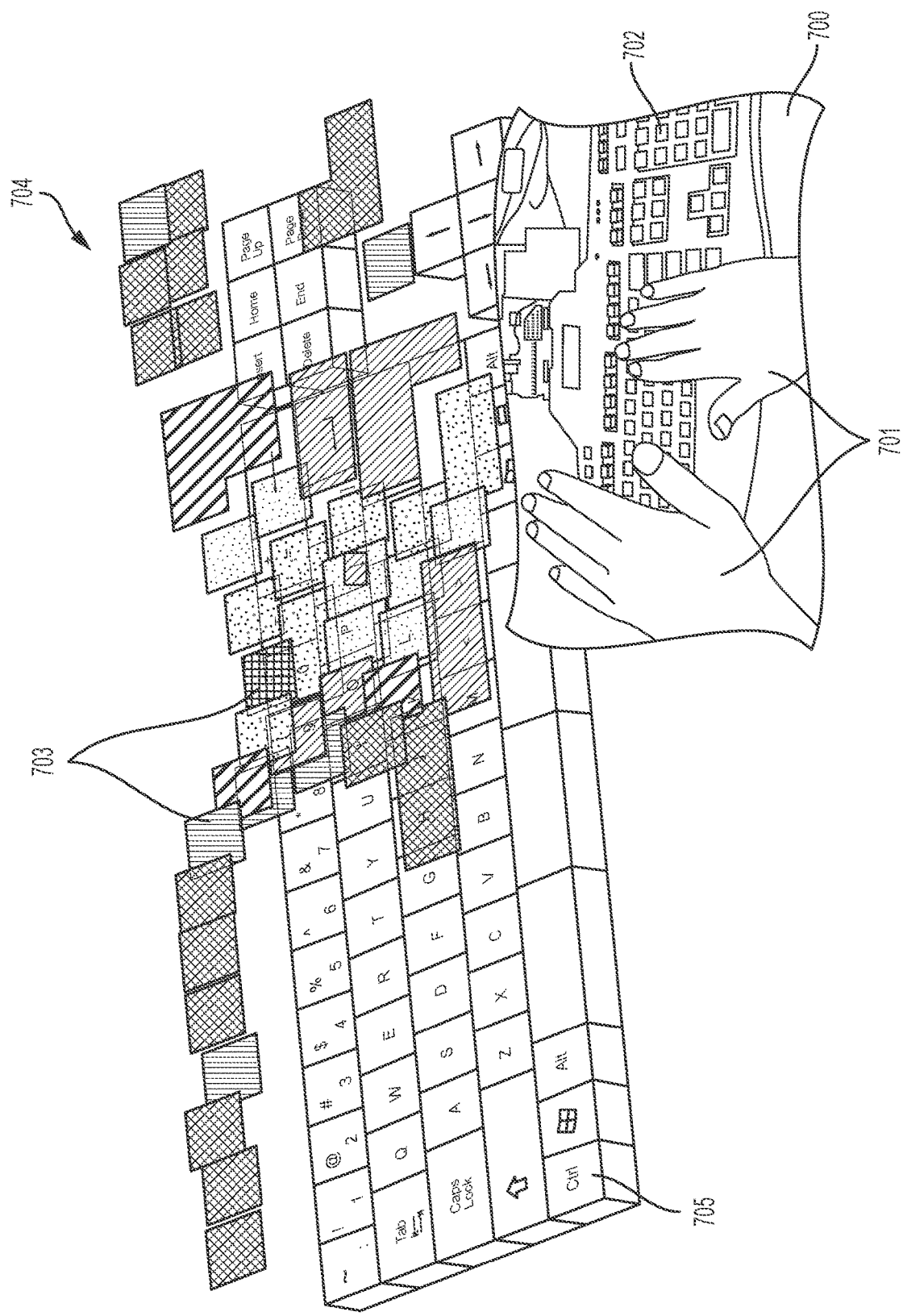
FIG. 7 shows an exemplary keyboard with a user's hands positioned in proximity thereto, and an illustration of that keyboard with a computer generated heat map superimposed on the illustrated keyboard to correspond to the positioning and proximity of the user's hands with the exemplary keyboard.
Figure 8:
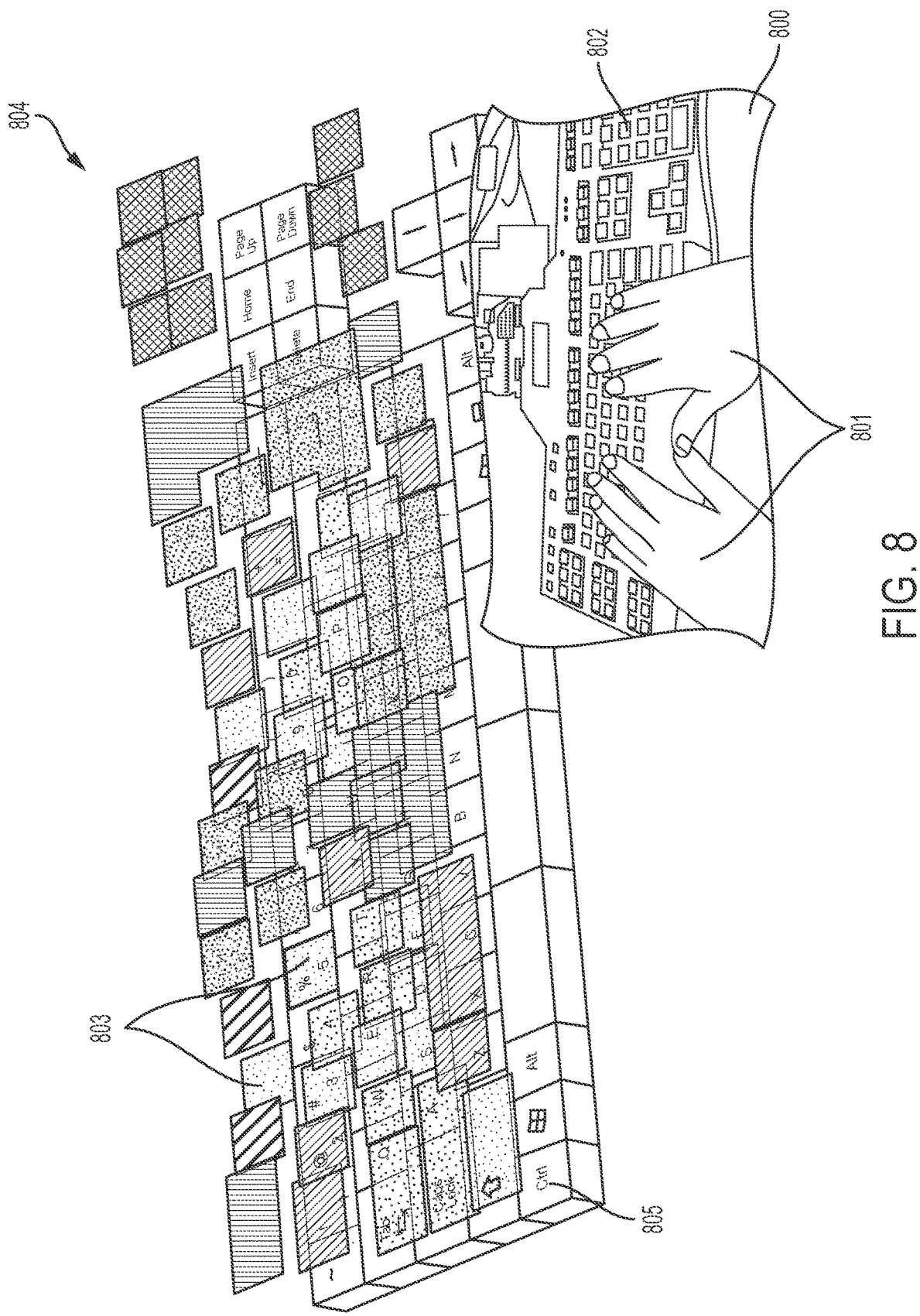
FIG. 8 shows another view of the exemplary keyboard with a user's hands repositioned in proximity thereto, and an illustration of that keyboard having an illustration of a computer generated heat map superimposed thereon.

Turning now to FIGS. 7 and 8 which show an illustrative example of computer-generated touch state information displayed above a depiction of a touch sensitive keyboard according to the present disclosure. The inset pictures 700, 800 in FIGS. 7 and 8 show the position of hands 701, 801 with respect to an exemplary physical keyboard 702, 802. Both height above the keyboard illustration and color 703, 803 are used to for the purposes of the touch state illustration. The heights and colors shown are merely illustrative. As illustrated in FIGS. 7 and 8, an embodiment of the physical keyboard 702, 802 disclosed herein may be used to provide information concerning the touch state of each keyboard switch, which, as illustrated, can provide a visual display 704, 804 of hover, key contact and key depress. Specifically, FIG. 7 shows an exemplary keyboard 702 according to the disclosure, with a user's hands 701 positioned in proximity thereto and an illustration of that keyboard 705 with a computer-generated heat map 703 superimposed thereon. The computer-generated heat map 703 corresponds to the touch states of the various keyboard switches, and thus, is intended to correspond to the positioning and proximity of the user's hands with the exemplary keyboard 702. FIG. 8 shows another view of the exemplary keyboard 802 with the user's hands 801 repositioned from FIG. 7, and an illustration of that keyboard 805 having a computer-generated heat map 803 superimposed thereon.

In an embodiment, a reconstruction of the hover, contact and pressure information may be configured to display as a 3-D model, allowing a user to see his or her fingers, and potentially hands, wrists and/or forearms relative to the keyboard in a VR/AR view. In an embodiment, the range of touch states corresponding to hover extend at least 5 mm from the surface of the keyboard switches. In an embodiment, the range of touch states corresponding to hover extend at least 10 mm from the surface of the keyboard switches. In an embodiment, the range of touch states corresponding to hover extend substantially more than 10 mm from the surface of the keyboard switches.

In an embodiment, on-the-fly tuning may be done to permit extended hover while maintaining a contact-sensitive keyboard. In an embodiment, different orthogonal signals are used in a non-hover state, and hover state from the signals used in the range of contact states; or in a far-hover state versus a near-hover state. In an embodiment, different physical antennae are used to transmit and receive signals in a non-hover state, and hover state from the antennae used in the range of contact states; or in a far-hover state versus a near-hover state.

U.S. patent application Ser. No. 15/162,240, filed May 23, 2016, entitled "Transmitting and Receiving System and Method for Bidirectional Orthogonal Signaling Sensors," the entire disclosure of which is incorporated herein by reference, provides user, hand and object discrimination in a fast multi-touch sensor. In an embodiment, bidirectional orthogonal signaling is used in connection with a touch sensitive keyboard to provide the benefits as explained in that application. Where bidirectional orthogonal signaling is used, each of the antennae may be used as both receive and transmit antennae.

The entire disclosure of U.S. patent application Ser. No. 14/466,624, filed Aug. 22, 2014, entitled "Orthogonal Signaling Touch User, Hand and Object Discrimination Systems and Methods," is incorporated herein by reference. In an embodiment, the keyboard or keyboard switch disclosed herein can distinguish between the hands and fingers of multiple users, different hands of the same user, different fingers of the same user, and hands and objects.

Figure 9:
FIG. 9 is an illustration showing a hybrid of a user's view and real-world view of a featured keyboard.

FIG. 9 shows a hybrid view partially representing a user's VR/AR view and partially representing a real-world view of a featured keyboard. In VR/AR settings, in an embodiment, each interactive key on the keyboard can become an independent, interactive touch display. Allowing the keyboard to adapt more flexibility to software defined or related tasks, and providing dynamic visual feedback to the user while using the keyboard. In an embodiment, 3-D modeling can be employed using the touch state information from the disclosed touch sensitive keyboard to provide a user with a view of his or her fingers, hands, wrists, forearms, and even the keyboard in VR/AR settings.

The entire disclosure of U.S. patent application Ser. No. 14/490,363, filed Sep. 18, 2014, entitled "Systems and Methods for Providing Response to User Input Using Information about State Changes and Predicting Future User Input," is incorporated herein by reference. In an embodiment, the touch state information may be used in connection with prediction of user's actions, and such predictions can be used to mitigate or eliminate latency.

Figure 10:
FIG. 10 is an illustration showing a hybrid of a user's view and real-world view of a feature-sparse keyboard.

FIG. 10 shows a hybrid view partially representing a user's VR/AR view and partially representing a real-world view of a feature-sparse keyboard. As used herein, the term feature-sparse keyboard includes surfaces without specific physical keys having a generally fixed key-spacing. For example, an iPad or mobile phone keyboard can be considered a feature-sparse keyboard. However, the term feature-sparse keyboard also includes keyboards that include some physical features, and may include haptic feedback to present keys or other features of a keyboard. Such haptics may include, without limitation, moving mechanical parts, robotic graphics, electrostatic feedback and/or electroshock feedback. In VR/AR settings, in an embodiment, feature-sparse and/or haptic keyboard can become an independent, interactive touch display. In VR/AR settings, through techniques known in the art, a feature-sparse haptic keyboard may tactually seem to have keys and may provide dynamic physical feedback to the user while using the keyboard in this setting. In VR/AR settings, through techniques known in the art, the feature-sparse and/or haptic keyboard may visually appear to have keys and/or labels and may provide dynamic physical feedback to the user while using the keyboard in this setting. Thus, even though the user sees limited features or no features at all in a real-world setting, key outlines and labels can be added in the VR/AR setting.

Figure 11:
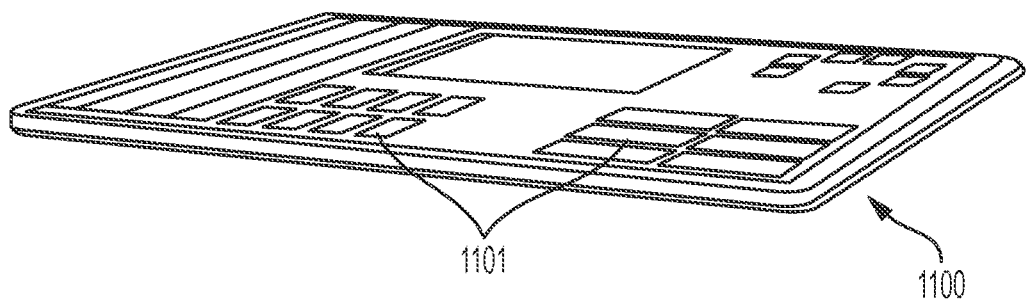
FIG. 11 shows an exemplary embodiment of a featured keyboard.
Figure 12A:
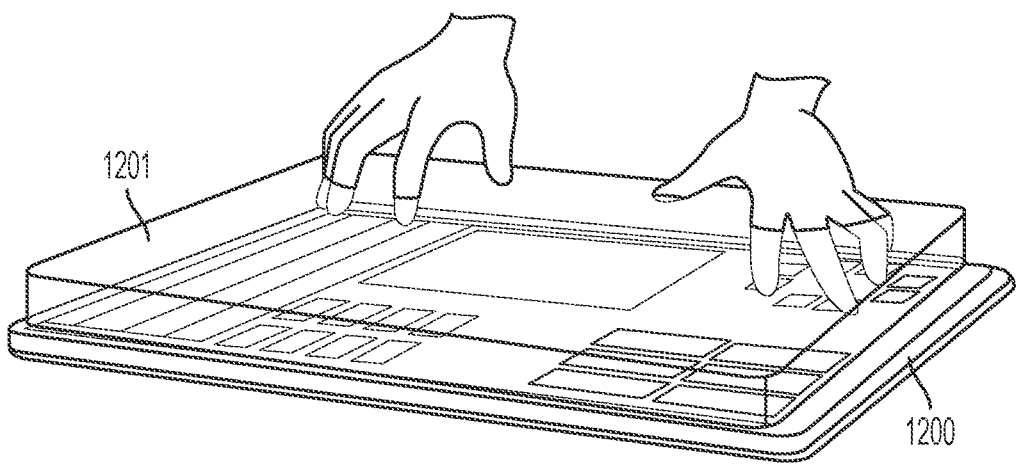
FIG. 12A shows an illustrative sensor range of a featured keyboard.
Figure 12B:
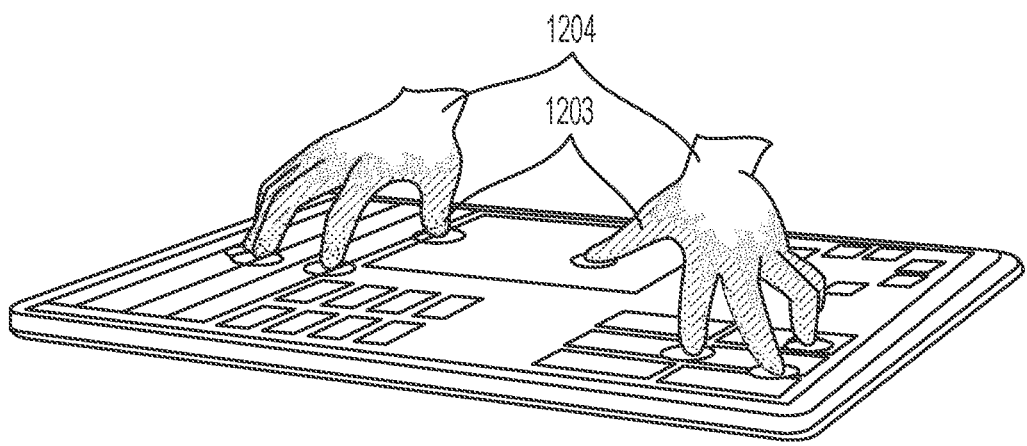
FIG. 12B shows an example of a heat map of the user's fingers and hands within the sensor range on a featured keyboard.

FIGS. 11 and 12A-C depict several embodiments that can be used with the methods and apparatus disclosed herein. FIG. 11 illustrates an exemplary embodiment of a keyboard 1100 having physical features 1101 in the real-world setting. In an embodiment, and as described above, the keyboard may be a feature-sparse and/or haptic keyboard used in a VR/AR setting. FIG. 12A shows an example of the touch sensor range 1201 of a featured keyboard 1200 being used. While the sensor range 1201 is depicted, that depiction is just for illustrative purposes. In an embodiment, the keyboard 1200 may be a feature-sparse and/or haptic keyboard used in a VR/AR setting. In an embodiment, the sensor range 1201 of the touch sensor corresponds to the touch sensitivity of the keyboard switches on the keyboard 1200. FIG. 12B shows an example of a heat map 1203 of information within touch sensor range of the user's fingers and hands, and the extrapolation from the heat map 1203 of the user's wrists 1204.

Figure 12C:
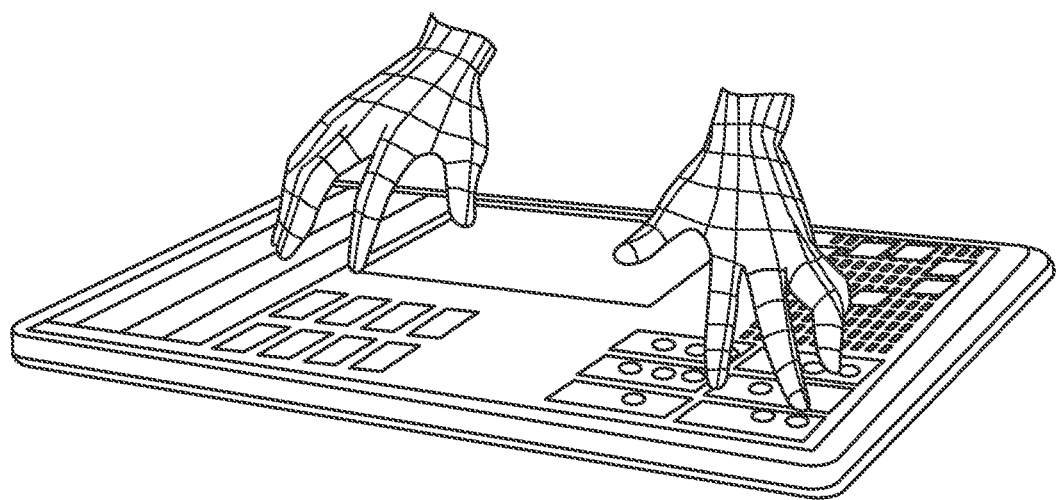
FIG. 12C shows an example of a user's fingers, hands, and wrists, and visual context, being recreated on a keyboard in virtual or augmented reality.

FIG. 12C shows an embodiment of a VR/AR world view of the same user's fingers, hands and wrists and a visual context as may be reconstructed for use in connection with keyboard in a VR/AR setting. In an embodiment, the touch state information can be used to reconstruct the user's fingers, hands and wrists in 3-D in VR/AR settings with low latency. The low latency may permit an VR/AR system to provide 3-D haptics, thus, providing the user with physical buttons and controllers on a real-world keyboard that mirrors software defined buttons and controls of a VR/AR keyboard. For example, in an embodiment, 3-D haptics may create physical input surfaces that can flexibly deform their physical controls to match the VR/AR digital controls of a given VR/AR application. In an embodiment, haptics may cause a user to perceive physical input surfaces to match the VR/AR digital controls of a given VR/AR application. In an embodiment, physical or haptic interfaces are provided that can be fit to their intended use and that mirror their digital equivalents in VR/AR settings.

Because contact is not required, in an embodiment, touch state information may be used as an input to a gesture interpretation algorithm. Thus, a location at a distance above the keyboard could be turned into a zone where a user could gesture. Such a zone may be modal, and itself activated by a gesture, contact or key press or combination of gestures, contact or key presses. In an embodiment, the hand can be used as a computer mouse, making the familiar movements without removal of the hand from proximity with the keyboard. In an embodiment, "cupping" the hand into a mouse-like shape will automatically cause further gestures from that hand to be interpreted as mouse gestures—including, e.g., button clicks, wheel rotation and movement. In an embodiment, a tapping motion in the air can be interpreted as a gesture, and may result in a system response. In an embodiment, the surface of a key or a subset of keys could act as a track pad when the user skims or makes some other type of gesture with his or her fingers or hand on them.

Figure 13:
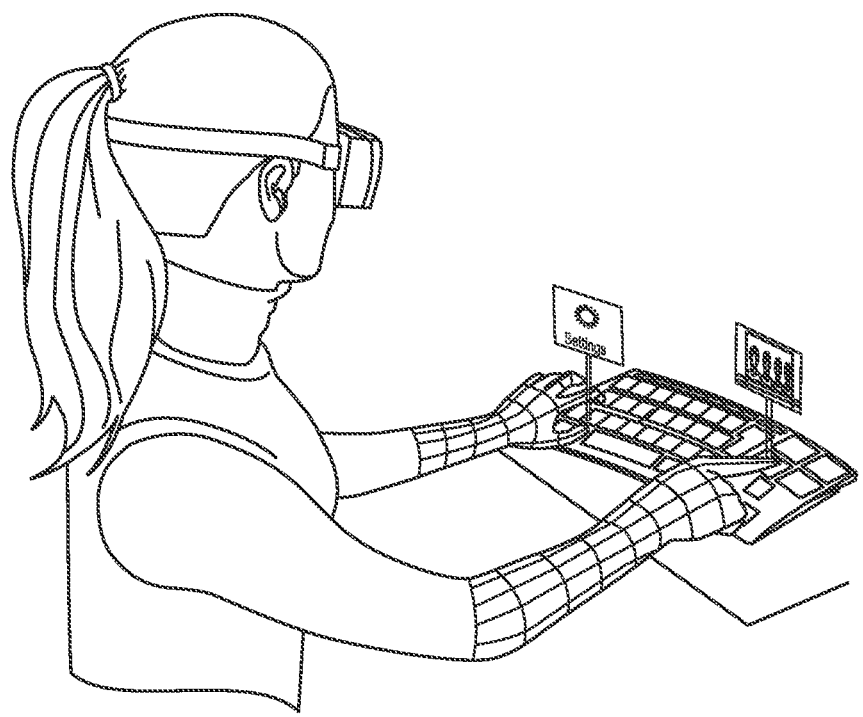
FIG. 13 is an illustration showing a hybrid of a user's view and real-world view of a keyboard displaying floating tool-tips in the user's virtual or augmented reality view.

The touch state information provided by the novel keyboard switches and keyboard presented herein allows application and operating system software to have information from which resting on, or hovering over a physical key (or VR/AR key) can be identified. Turning to FIG. 13, an exemplary implementation of tool-tipping is shown. FIG. 13 provides an exemplary illustration of a hybrid view of a user's view and real-world view of the keyboard offering the user a floating tool-tip to, for example, assist in learning keyboard shortcuts for a given application or operating system since the keyboard can either sense a user resting on or hovering above the keys or predict the user's next key press(es) before the user makes contact with the keys. In an embodiment, the touch state information is used to determine particular positions or combinations of positions where a tool-tip or other feedback is desirable, and such tool-tip or other feedback can be presented in the VR/AR representation. Similarly, additional display space may be desirable in the form of a balloon, such that, for example, where a user hovers over or contacts a keyboard switch (or combination) a balloon may be displayed, such as, the "next song" that may play if a "next" key is pressed. In an illustrative embodiment, the disclosed keyboard enables a VR/AR user interface mapped to a physical input surface, which includes but is not limited to a keyboard. In doing so, each key on the keyboard can be a multi-touch, gestural display since each key on the physical keyboard can become a visual screen in a VR/AR setting. For example, the VR/AR user interface elements can be mapped to physical keyboard input controls as interactive 2-D icons, images and text (e.g., a volume button control that shows the current volume-level, etc.) and even as 3-D icons, images and text (e.g., a play button that appears when the user rests his or her finger on the associated physical key thereby creating a 3-D tool-tip along the z-axis that shows the user what album will be played via the display of album-art imagery, etc.).

The present systems are described above with reference to devices for keyboards sensitive to hover, contact and pressure in frequency division modulated touch systems. It is understood that each operational illustration may be implemented by means of analog or digital hardware and computer program instructions. Computer program instructions may be provided to a processor of a general purpose computer, special purpose computer, ASIC, or other programmable data processing apparatus, such that the instructions, which execute via a processor of a computer or other programmable data processing apparatus, implements the functions/acts specified. Except as expressly limited by the discussion above, in some alternate implementations, the functions/acts may occur out of the order noted in the operational illustrations.

While the invention has been particularly shown and described with reference to a preferred embodiment thereof, it will be understood by those skilled in the art that various changes in form and details may be made therein without departing from the spirit and scope of the invention.

The invention claimed is:

1. A keyboard, comprising:
   plurality of keyboard switches for detecting touch, each keyboard switch comprising:
   key base;
   key cover, the key cover being at least partially movable with respect to the key base;
   a transmit antenna and a receive antenna, the transmit and receive antennas being configured such that no portion of the transmit antenna touches any portion of the receive antenna, wherein at least one of the transmit and receive antennas is directly mechanically coupled to the key cover to be movable with respect to the other;
   wherein the transmit antenna is adapted to be used to transmit one or more source signals; and
   wherein the receive antenna is adapted to be used to capture a frame of signals.

2. The keyboard of claim 1, wherein each of the one or more source signals are frequency-orthogonal with each other of the one or more source signals.

3. The keyboard of claim 1, wherein the range of touch states is a range of at least four states.

4. The keyboard of claim 1, wherein at least one of the range of touch states corresponds to a hover state.

5. The keyboard of claim 1, wherein at least one of the range of touch states corresponds to a no hover state.

6. The keyboard of claim 1, wherein the range of touch states is a range of at least 256 different states.

7. The keyboard of claim 1, wherein a plurality of the range of touch states corresponds to a hover state.

8. The keyboard of claim 1, wherein a plurality of the range of touch states corresponds to contacted state.

9. The keyboard of claim 1, further comprising:
   further transmit antenna associated with at least one of the plurality of keyboard switches, the further transmit antenna being positioned such that no portion thereof touches any portion of the transmit antenna or the receive antenna for the at least one of the plurality of keyboard switches;
   wherein the further transmit antenna is adapted to transmit one or more additional signals, the one or more additional signals being frequency-orthogonal with each of the one or more source signals.

10. The keyboard of claim 1, further comprising:
    further receive antenna associated with one of the plurality of keyboard switches;
    wherein the further receive antenna is adapted to capture a frame of signals; the further receive antenna being positioned such that no portion thereof touches any portion of the transmit antenna or the receive antenna associated with the one of the plurality of keyboard switches.

11. A keyboard switch for detecting touch, the keyboard switch comprising:
    key base;
    key cover, the key cover being movable with respect to the key base, wherein the key cover comprises a conductive substrate to magnify capacitive effect;
    transmit antenna and a receive antenna, the transmit and receive antennas being configured such that no portion of the transmit antenna touches any portion of the receive antenna, wherein at least one of the transmit and receive antennas is directly mechanically coupled to the key cover to be moveable with respect to the other;
    wherein the transmit antenna is adapted to be used to transmit one or more source signals; and
    wherein the receive antenna is adapted to be used to capture a frame of signals.

12. The keyboard switch of claim 11, wherein:
    the transmit antenna is adapted to transmit an additional signal simultaneously with the source signal, the additional source signal and the source signal being orthogonal to each other.

13. The keyboard switch of claim 11, wherein the additional source signal and the source signal are frequency orthogonal to each other.

14. The keyboard switch of claim 11, further comprising:
    second transmit antenna associated with the keyboard switch, the second transmit antenna being spaced apart from the transmit antenna and the receive antenna such that no portion of the second transmit antenna touches any portion of the transmit antenna or the receive antenna;
    wherein the second transmit antenna is adapted to cause the second transmit antenna to transmit an additional source signal, wherein the additional source signal is orthogonal to the source signal.

15. The keyboard of claim 11, wherein only a portion of the key cover is moveable with respect to the key base.

16. The keyboard switch of claim 11, further comprising:
    second receive antenna associated with the keyboard switch, the second receive antenna being spaced apart from the transmit antenna and the receive antenna such that no portion of the second receive antenna touches any portion of the transmit antenna or the receive antenna; and second signal receiver coupled to the second receive antenna, the second signal receiver adapted to capture a second frame of signals present on the second receive antenna.

17. The keyboard switch of claim 16, wherein the key cover comprises a conductive substrate to magnify capacitive effect.

* * * * *